(12) United States Patent
Uchiyama

(10) Patent No.: US 7,006,334 B2
(45) Date of Patent: Feb. 28, 2006

(54) MAGNETIC DISC DEVICE PIEZOELECTRIC ACTUATOR WITH MIRROR-SYMMETRICAL RELATIONSHIP AND CONNECTION ARRANGEMENT

(75) Inventor: Hirokazu Uchiyama, Osaka (JP)

(73) Assignee: Matsushita Electic Industrial Co., Ltd., Osaka (JP)

( * ) Notice: Subject to any disclaimer, the term of this patent is extended or adjusted under 35 U.S.C. 154(b) by 188 days.

(21) Appl. No.: 10/387,378

(22) Filed: Mar. 14, 2003

(65) Prior Publication Data

US 2003/0223155 A1 Dec. 4, 2003

(30) Foreign Application Priority Data

Mar. 15, 2002 (JP) .............................. 2002-071868

(51) Int. Cl.
  *G11B 5/596* (2006.01)
  *H01L 41/047* (2006.01)
  *H02N 2/04* (2006.01)
(52) U.S. Cl. ..................... 360/294.4; 310/366
(58) Field of Classification Search ............ 360/294.4; 310/366, 357
See application file for complete search history.

(56) References Cited

U.S. PATENT DOCUMENTS 6,501,625 B1 * 12/2002 Boismier et al. ........ 360/294.7

FOREIGN PATENT DOCUMENTS

| JP | 6-224483 | 8/1994 |
| JP | 7-30163 | 1/1995 |
| JP | 8-88419 | 4/1996 |
| JP | 11-142753 | 5/1999 |

OTHER PUBLICATIONS

Partial Translation of IDEMA Japan News No. 32, pp4-7, Switching To Super-High TPI and Piggy-Back Actuator, Yukihiro Uematsu, Fujitsu Limited.

* cited by examiner

*Primary Examiner*—Craig A. Renner
(74) *Attorney, Agent, or Firm*—Wenderoth, Lind & Ponack, L.L.P.

(57) ABSTRACT

An actuator comprises first and second structures each with a piezoelectric layer sandwiched between a main electrode layer and an opposed electrode layer, which structures are formed on two substrates, respectively. A first main electrode layer and a first opposed electrode layer are provided with layer two projections, and a second opposed electrode layer is provided with one layer projection. Connection wiring is arranged for establishing connection, with the above two structures bonded to each other, between the layer projection of the first main electrode layer and the second main electrode layer, and between the layer projection of the first opposed electrode layer and the layer projection of the second opposed electrode layer. Thus, it is possible to provide an actuator which may assure highly accurate position control.

10 Claims, 21 Drawing Sheets

MAGNETIC DISC DEVICE PIEZOELECTRIC ACTUATOR WITH MIRROR-SYMMETRICAL RELATIONSHIP AND CONNECTION ARRANGEMENT

FIELD OF THE INVENTION

The present invention relates to a thin film piezoelectric element and its manufacturing method, and an actuator using the thin film piezoelectric element.

BACKGROUND OF THE INVENTION

With the recent advance of semiconductor technology, efforts are made in various ways to realize a micro-machine capable of considerable miniaturization with use of advanced semiconductor manufacturing technology, and electro-mechanical elements such as micro-actuators are now spotlighted. By using such elements, small-sized highly accurate mechanical components can be obtained, and productivity can be greatly improved by performing a semiconductor process. Particularly, micro-actuators using piezoelectric elements are used for fine displacement of a scanning tunneling microscope and for fine positioning of a head slider of a magnetic recording and reproducing disk device.

For example, in a magnetic recording and reproducing disk device, a magnetic head for recording and reproducing information on a magnetic disk is mounted on a head slider, and the head slider is fitted to an actuator arm. The actuator arm is oscillated by a voice coil motor (hereinafter called VCM), then the magnetic head is positioned to a predetermined track position on the magnetic disk to execute a recording or reproducing operation. However, with enhancement in recording density, using only such a conventional VCM is not enough to assure sufficient accuracy. Therefore, in addition to a VCM positioning device, a high-speed highly accurate positioning technology, in that a head slider is finely driven by a fine positioning device using piezoelectric elements, is proposed for example, extra-high TPI and piggyback actuator (IDEMA Japan News No.32, pp 4–7, issued by International Disk Drive Equipment Materials Association in Japan).

Thus, actuators using piezoelectric elements are expected to be employed for various purposes. Conventionally, a configuration multilayered by a green-sheet lamination method or thick film multilayer formation method has often been employed (for example, Japanese patent public presentation official report No. H6-224483). However, one layer of a piezoelectric element manufactured by such a manufacturing method is about 10 μm in thickness, requiring a driving voltage of about 100V.

On the other hand, in Japanese patent public presentation official report No. H8-88419 is disclosed a thin film laminate type actuator that is small-sized and can be driven by application of a low voltage and is large in an amount of displacement; its manufacturing method is also disclosed. That is, an electrode layer made of platinum, aluminum, gold or silver, a piezoelectric layer made from a piezoelectric material such as lead zirconate titanate (PZT) and lead lanthanum zirconate titanate (PLZT), and an electrode layer made from a material similar to the above materials are formed on a single-crystal substrate such as magnesium oxide, strontium titanate or sapphire. Further, a bonding layer consisting of glass or silicon is formed thereon in order to manufacture a piezoelectric member.

Next, piezoelectric members are bonded to each other via a bonding layer by performing an anode joining method, and after that, the substrate at a laminating side is removed by grinding or the like, and a bonding layer is formed on the electrode layer then exposed, and the bonding layer is bonded to a bonding layer of another piezoelectric member produced by the above-mentioned procedure, and a substrate is again removed. By repeating these steps, a laminate body with a plurality of laminated layers is formed. After that, inner electrodes in the laminate body are alternately extended from either side to achieve a laminate type actuator. During this manufacturing method, the substrate is removed by etching after grinding so that no residual portion is allowed to exist. Also, as a method of bonding piezoelectric members to each other, it is stated that a surface activation joining method or adhesive joining method can be employed besides an anode joining method.

However, in the above example, since an external electrode is formed via an insulating layer from two sides of a laminate body multilayered with piezoelectric members, it is necessary to form an external electrode for every individual laminate body, so that a problem of productivity arises. Also, since displacement takes place in a perpendicular direction to a substrate surface, the resulting configuration is not suitable, for example, for a structure used as a micro-actuator of a head slider of a magnetic recording and reproducing disk device.

SUMMARY OF THE INVENTION

The present invention is intended to provide a thin film piezoelectric element, its manufacturing method, and an actuator using the element which are, in manufacture of two-layer thin film piezoelectric elements, able to improve reproducibility of shape in etching of piezoelectric thin films, and able to prevent short-circuiting trouble or similar trouble between electrodes sandwiching a piezoelectric thin film. The thin film piezoelectric element is less in variations of piezoelectricity and is suited for mass-production with high yield.

The thin film piezoelectric element of the present invention comprises:

a structure in which a first piezoelectric thin film is sandwiched between a first main electrode layer and a first opposed electrode layer, with the first main electrode layer and the first opposed electrode layer each having a projection extended from a surface provided with a first main electrode, a second piezoelectric thin film is sandwiched between a second main electrode layer and a second opposed electrode layer in a mirror-symmetrical relationship with respect to the first piezoelectric thin film, with the second opposed electrode layer having a projection extended at a surface of the second main electrode layer, and the first opposed electrode layer and the second opposed electrode layer are opposed and bonded to each other;

an insulating resin layer formed at an outer periphery of a structure resulting from bonding the first opposed electrode layer and the second oppose electrode layer to each other; and connection wiring arranged on the insulating resin layer in order to establish electrical connection between a projection of the first main electrode layer and the second main electrode layer, and between a projection of the first opposed electrode layer and a projection of the second opposed electrode layer.

Since the piezoelectric thin films opposed and bonded to each other are of the same shape, this configuration allows amounts of displacement to be the same when a voltage is applied to these piezoelectric thin films. As a result, it is possible to obtain piezoelectricity of which warp or bending is hardly superposed against expansion and contraction, and to obtain a highly accurate actuator. Also, etching to form via-holes in the piezoelectric thin films is not necessary. Accordingly, it is possible to eliminate residual impurities such as a side wall deposit due to etching, to prevent generation of trouble such as short-circuiting between electrodes, and to achieve a thin film piezoelectric element excellent in high yield and productivity. Further, since the piezoelectric thin films are protected by an insulating resin layer and insulating interlayer, it is effective to enhance environmental resistance.

DETAILED DESCRIPTION OF THE PREFERRED EMBODIMENTS

Preferred embodiments of the present invention will be described in the following with reference to the drawings.

First Exemplary Embodiment

Figure 1:
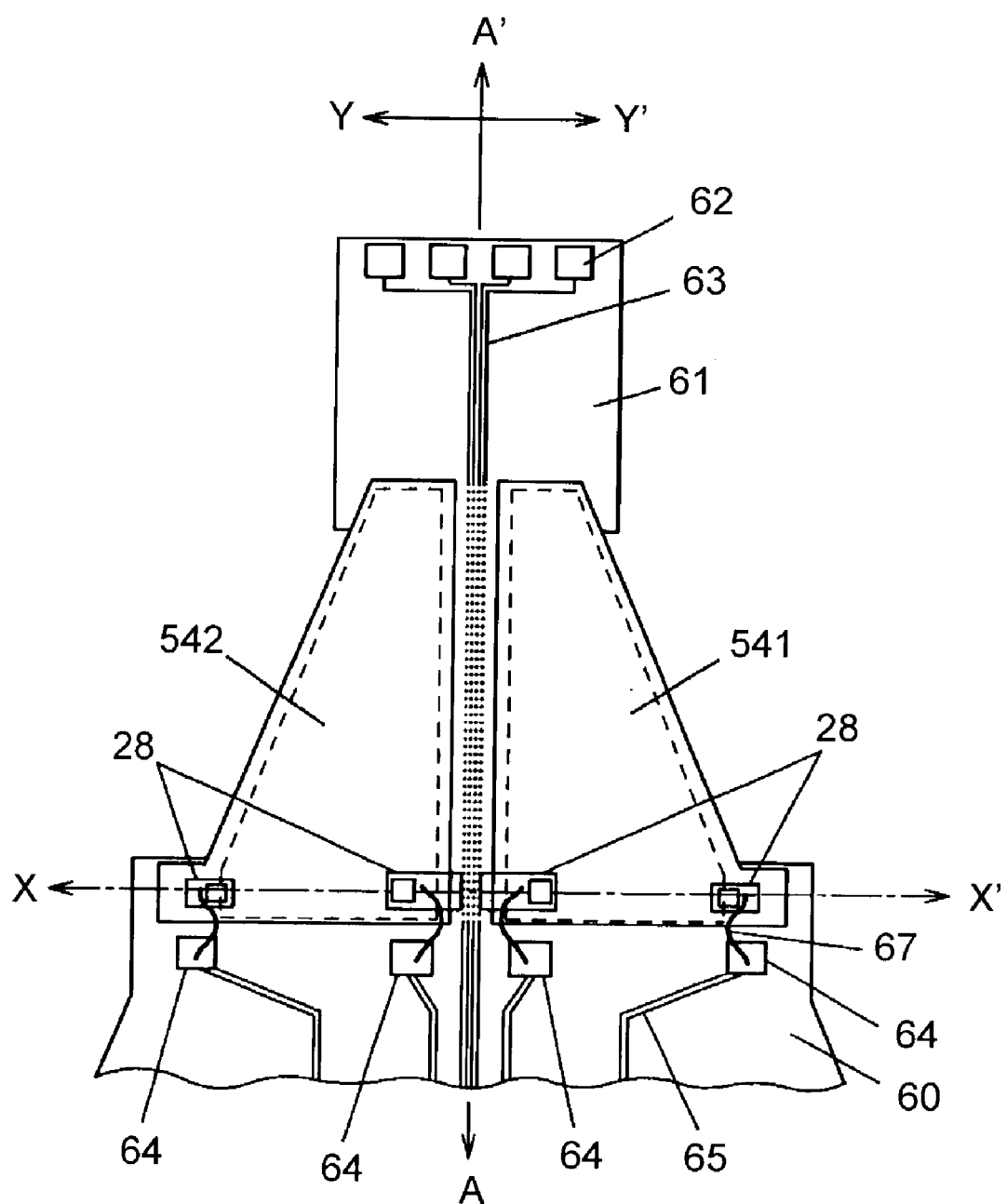
FIG. 1 is a plan view of an actuator using a pair of thin film piezoelectric elements of the present invention.

FIG. 1 shows a plan view of an actuator comprising thin film piezoelectric elements as a pair in a first exemplary embodiment of the present invention. The actuator is used for highly accurate fine positioning of a head slider to a predetermined track position on a disk in a magnetic recording and reproducing disk device. The actuator shown in FIG. 1 has two thin piezoelectric elements 541, 542. These thin film piezoelectric elements 541, 542 as a pair are structurally in a mirror-image relationship relative to each other against the A–A' line, and are bonded to flexure 60 by an adhesive resin layer (not illustrated). After bonding, connection electrode pads 28 disposed on thin film piezoelectric elements 541, 542 are connected to piezoelectric electrode pad 64 disposed on flexure 60 by using, for example, wire leads 67, thereby forming an actuator for finely positioning a magnetic head.

Flexure 60 includes a slider holding portion 61 for fixing a head slider (not illustrated), extending from a region where thin film piezoelectric elements 541, 542 are bonded. On slider holding portion 61 are disposed head electrode pads 62 for connecting to a wiring portion of a magnetic head (not illustrated) mounted on the head slider (not illustrated). Head electrode wiring 63 is arranged, from head electrode pads 62, on flexure 60 between thin film piezoelectric elements 541, 542, which is further led to a connection pad (not illustrated) for connecting to external equipment, as is piezoelectric electrode wiring 65 led from piezoelectric electrode pads 64.

Figure 2:
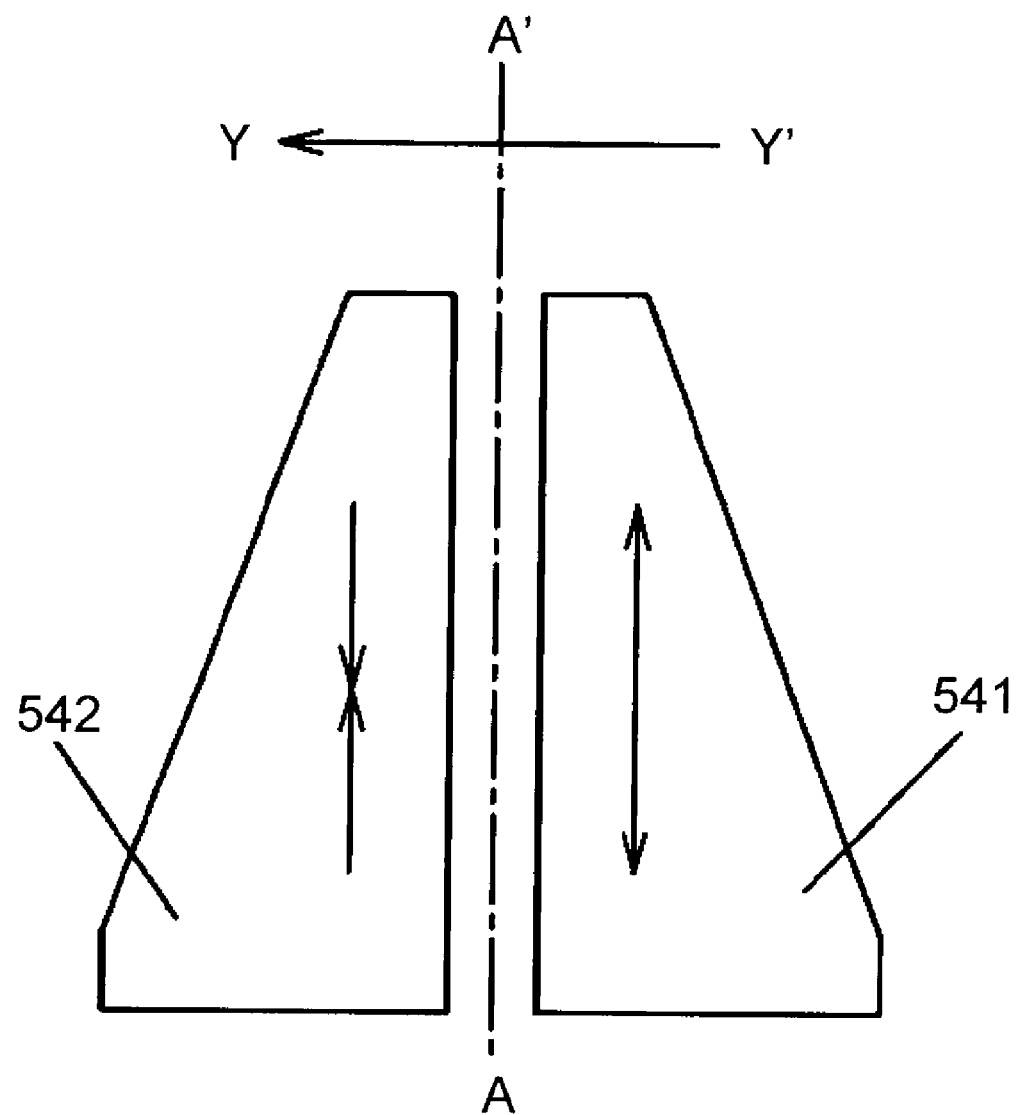
FIG. 2 is a conceptual diagram for describing operation of the actuator.

Operation of the actuator having such a configuration is described in the following. When a voltage is applied in reverse polarity to thin film piezoelectric elements 541, 542 as a pair, one thin film piezoelectric element 541 is expanded, while the other thin film piezoelectric element 542 is contracted as shown in FIG. 2. These two displacements in opposite but parallel directions act upon slider holding portion 61 such that slider holding portion 61 receives a resultant force and slightly moves in the direction of the Y–Y' line. By controlling such slight movement with high accuracy, the magnetic head can be highly accurately positioned to a predetermined track position on a disk (not illustrated). For example, when a piezoelectric thin film thickness of thin film piezoelectric elements 541, 542 is set to 2.5 $\mu$m and a voltage of 5V is applied between a main electrode layer and an opposed electrode layer, it is possible to make displacement of the magnetic head ±0.8 $\mu$m in the direction of the Y–Y' line.

Figure 3:
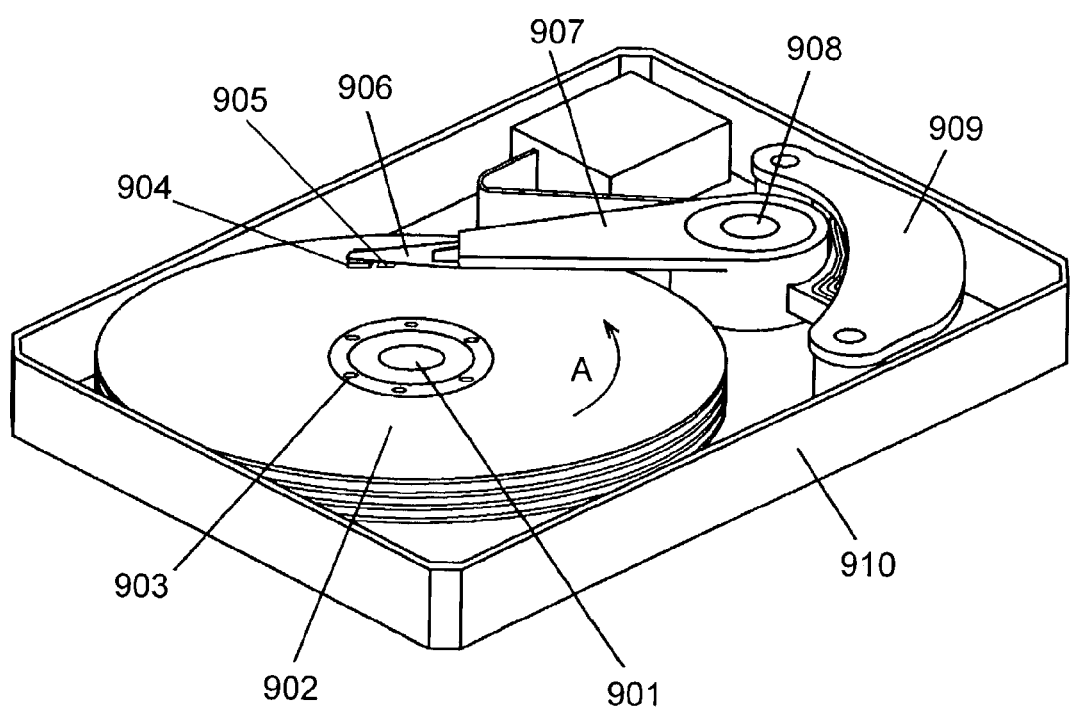
FIG. 3 is a perspective view of an essential portion of a magnetic recording and reproducing disk device using the actuator.

A perspective view of an essential portion of a magnetic recording and reproducing disk device using the actuator is shown in FIG. 3. Magnetic disk 902 is fixed on main shaft 901, which is rotationally driven at a predetermined speed by a rotating device 903. As the rotating device, a spindle motor is generally employed. Suspension 906 with a flexure (not illustrated) disposed on a disk side is fixed on arm 907, and arm 907 is supported to revolve with aid of bearing 908 so as to be turnable. Head slider 904 and actuator 905 having a pair of piezoelectric elements are fixed on a flexure (not illustrated). Arm 907 is oscillated by first positioning device 909 for positioning head slider 904 to a predetermined track position on magnetic disk 902. In a conventional magnetic recording and reproducing disk device, only first positioning device 909 is used, but in the present exemplary embodiment, head slider 904 is further finely moved by actuator 905 mounted on the flexure as described above. Since fine movement of this actuator 905 can be controlled by the voltage applied to the piezoelectric elements, it is possible to sufficiently follow even a minute track position and also possible to execute high density recording and reproducing operations. The entire magnetic recording and reproducing disk device is covered by casing 910 and a lid (not shown).

Figure 4A:
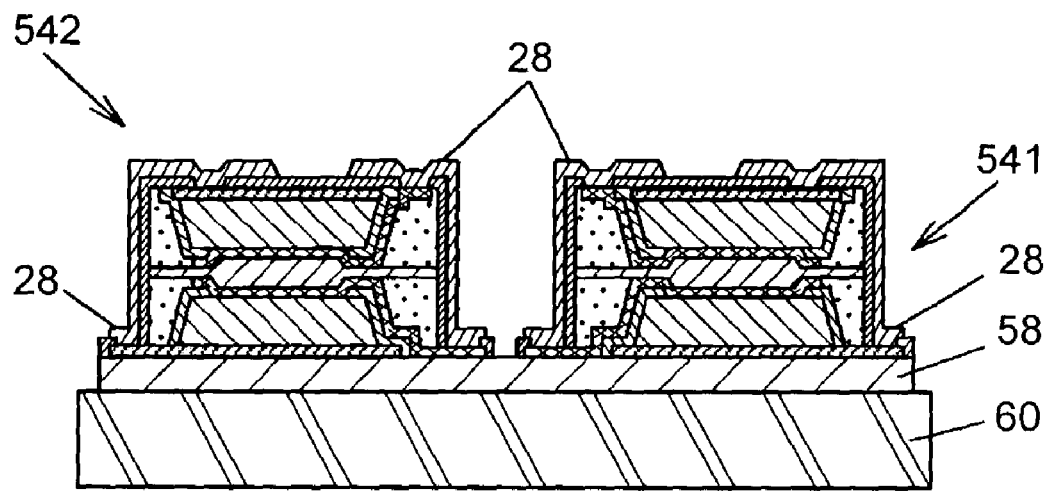
FIG. 4A is a sectional view of the actuator along the X–X' line shown in FIG. 1.
Figure 4B:
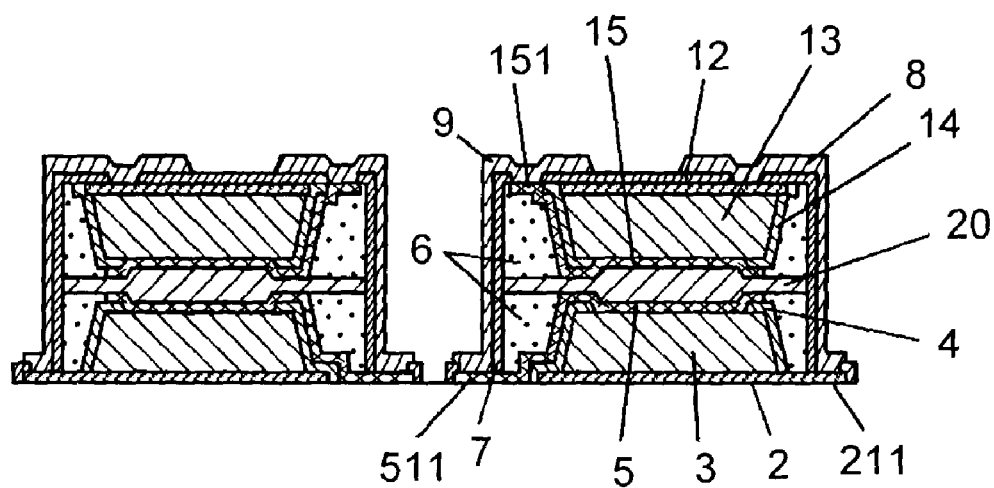
FIG. 4B is a sectional view of only a thin film piezoelectric element along the X–X' line shown in FIG. 1.

Sectional structures of thin film piezoelectric elements 541, 542 comprising the actuator are shown in FIG. 4A and FIG. 4B. FIG. 4A shows a cross-sectional configuration along the X–X' line of FIG. 1, and FIG. 4B shows a cross-sectional configuration of only thin film piezoelectric elements 541, 542.

First piezoelectric thin film 3, sandwiched between first main electrode layer 2 and first opposed layer 5, is bonded by adhesive layer 20 to second piezoelectric layer 13, sandwiched between second main electrode layer 12 and second opposed electrode layer 15.

First opposed electrode layer 5 is flush with first main electrode layer 2 from a side portion of first piezoelectric thin film 3 via first insulating interlayer 4, and is partially extended up to an opposite position of first main electrode layer projection 211 of first main electrode layer 2, thereby forming first opposed electrode layer projection 511. Similarly, second opposed electrode layer 15 is flush with second main electrode layer 12 from a side portion of second piezoelectric thin film 13 via second insulating interlayer 14, and is partially extended up to a position at a side as first opposed electrode layer projection 511 of first opposed electrode layer 5, thereby forming second opposed electrode layer projection 151.

Also, a space between these piezoelectric thin films bonded to each other is filled with insulating resin layer 6. Third insulating interlayer 7 is formed so as to cover the insulating resin layer 6 and second main electrode layer 12. After an opening is made in third insulating interlayer 7 at a specified portion of each electrode layer by virtue of photolithography or an etching process, first connection wiring 8 and second connection wiring 9 are formed in order to connect first main electrode layer 2 to the second main electrode layer 12, and first opposed electrode layer 5 to second opposed electrode layer 15. First connection wiring 8 and second connection wiring 9 also serve as connection electrode pad 28 for establishing connection with piezoelectric electrode pad 64 on flexure 60. Thin film piezoelectric elements 541, 542 are constituted by such a configuration. Thin film piezoelectric elements 541, 542 as a pair are bonded by adhesive resin layer 58 to flexure 60. As this adhesive resin layer 58, commercially available one-liquid normal temperature hardening type epoxy resin or two-liquid type adhesive can be employed.

An insulating protective layer for protecting first connection wiring 8 and second connection wiring 9 may be provided with an opening at a specified portion. However, the configuration of the thin film piezoelectric elements in the present exemplary embodiment are not provided with such an insulating protective layer.

As is apparent from FIG. 1, FIG. 4A, and FIG. 4B, first piezoelectric thin film 3 and second piezoelectric thin film 13 are generally identical in shape., Since these piezoelectric thin films are the same in shape without difference in sectional shape caused due to via-hole formation or etching, they match each other in weight and centroidal position as piezoelectric thin films. Accordingly, first piezoelectric thin film 3 and second piezoelectric thin film 13 can be matched to each other in an amount of displacement and direction of displacement verses applied voltage, and the thin film piezoelectric elements for an actuator having a large amount of displacement with high accuracy can be obtained. By using such a configuration, each of the thin film piezoelectric elements as a pair may have a structure such that warp or bending is hardly superposed against expansion and contraction. Moreover, since these piezoelectric elements are used as a pair, displacement in a direction nearly perpendicular to directions of expansion and contraction can be highly accurately generated by expanding one of these elements and contracting the other. Also, by executing positioning with the same accuracy as in the prior art by using the first positioning device, and further executing fine positioning of nanometer order by using the second positioning device, it becomes possible to sufficiently follow a track on a magnetic disk even in a case where track pitch is miniaturized, and also to realize a magnetic recording and reproducing disk device with high recording density.

A method of manufacturing the thin film piezoelectric elements of the present invention will be described in the following with reference to the drawings.

FIG. 5A to FIG. 8B are block diagrams describing a manufacturing method of the first exemplary embodiment of the present invention. In the present exemplary embodiment, manufacture of the above paired thin film piezoelectric elements is described as an example. Also, for easier understanding with regard to configuration of wiring connections, a sectional shape along the X–X' line of FIG. 1 is used for description.

Figure 5A:
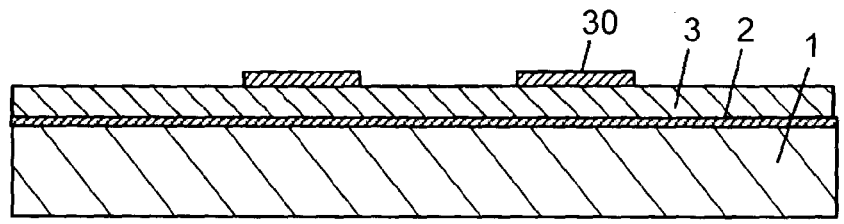
FIG. 5A is a block diagram of a step of forming a piezoelectric pattern resist on a first substrate during a manufacturing method of a first exemplary embodiment of the present invention.

First, film forming and processing on a first substrate 1 will be explained by using FIG. 5A to FIG. 5F. In FIG. 5A, first main electrode layer 2 and first piezoelectric thin film 3 are laminated onto first substrate 1, and first piezoelectric pattern resist 30 is formed for etching first piezoelectric thin film 3 into a predetermined shape.

To obtain first piezoelectric thin film 3 having excellent piezoelectricity, for example, it is preferable to use a magnesium oxide single-crystal substrate (MgO substrate) as first substrate 1, to form a platinum layer (Pt layer) with C-axis orientation as first main electrode layer 2 on the MgO substrate by sputtering, and to form a lead zirconate titanate (PZT) layer having piezoelectricity as piezoelectric thin film 3 on the Pt layer by sputtering. Then, by setting a temperature of the MgO substrate to about 600° C. for forming the PZT layer, it is possible to obtain a PZT layer polarized and oriented in a direction perpendicular to a layer surface. Also, as the first substrate 1, not only an MgO substrate but a strontium titanate substrate, sapphire substrate or silicon single-crystal substrate (Si substrate) can be used. As the first main electrode layer 2, not only a Pt layer but also a layer consisting of a metal such as gold (Au), iridium (Ir), rhodium (Rh), ruthenium (Ru), silver (Ag), rhenium (Re), and palladium (Pd), or their oxides can be used. Further, as the piezoelectric thin film, not only PZT but also lead lanthanum zirconate titanate (PLZT), barium titanate (BT), and the like can be used.

For etching first piezoelectric thin film 3 with use of first piezoelectric pattern resist 30 as a mask, it is possible to employ either dry etching or wet etching. Particularly, in the case of wet etching, a simple device is used and etching can be finished in a short time, which is advantageous because mass-productivity can be improved. When wet-etching a PZT layer, it is preferable to use a mixed solution of hydrofluoric acid and nitric acid, a mixed solution of hydrofluoric acid and nitric acid and acetic acid, or a mixture of these solutions, which is diluted with pure water. During an etching process, side etching can be lessened because the piezoelectric thin film includes only one layer, and therefore, variations in shape resulting from etching can be greatly reduced.

Figure 5B:
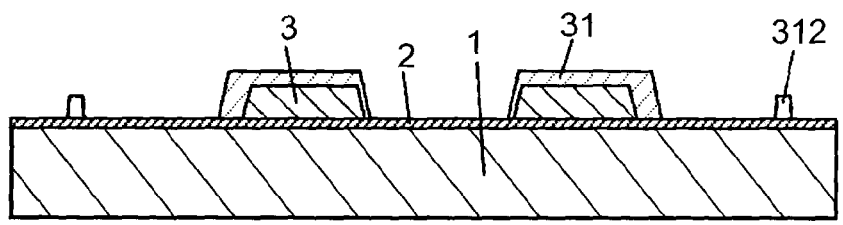
FIG. 5B is a block diagram of a step of forming a first main electrode pattern resist during the manufacturing method of the first exemplary embodiment.

After etching the first piezoelectric thin film 3 in this way, first main electrode pattern resist 31 as shown in FIG. 5B is formed in order to finish the first main electrode layer 2 into a predetermined shape. In this case, first marker resist 312 is formed at the same time as is pattern resist 31, which marker resist is used for positioning when patterns formed on first substrate 1 and second substrate 11, to be described later, are affixed to each other. However, it is not necessary to form the marker resist when positioning is executed by another method.

Figure 5C:
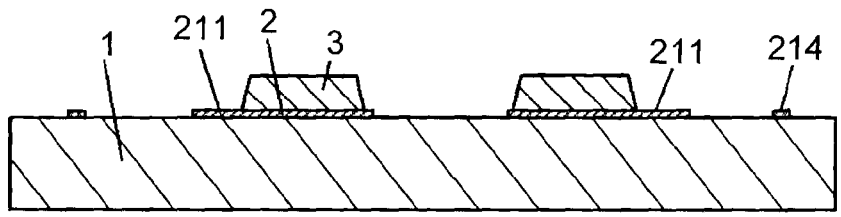
FIG. 5C is a block diagram of a step of etching a first main electrode layer during the manufacturing method of the first exemplary embodiment.

First main electrode layer 2 is at least larger than first piezoelectric thin film 3 as a whole, and a part of the layer is provided with first main electrode layer projection 211 which extends beyond first piezoelectric thin film 3. This is intended to prevent first piezoelectric thin film 3 from being exposed to a chemical solution used for removing first substrate 1 and becoming deteriorated, and to connect first main electrode layer projection 211 to second main electrode layer 12. By using first main electrode layer 2, first marker 214 is simultaneously manufactured by etching. A configuration of first main electrode layer 2 after etching is shown in FIG. 5C. When etching first main electrode layer 2, either dry etching or wet etching can be employed without any particular problems because this layer is thinner than first piezoelectric thin film 3, and an etching method can be freely selected according to material of the electrode layer.

Figure 5D:
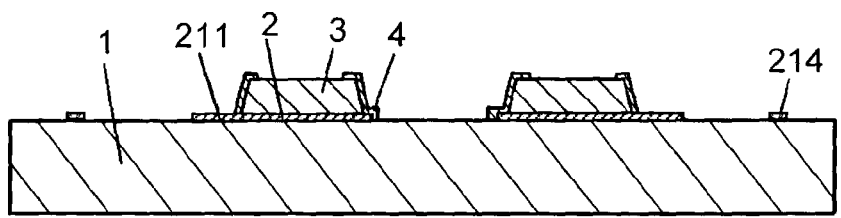
FIG. 5D is a block diagram of a step of forming a first insulating interlayer during the manufacturing method of the first exemplary embodiment.

Next, first insulating interlayer 4 is formed on a region where first opposed electrode layer 5 on first piezoelectric thin film 3 is formed, and on a region, except a predetermined region, of first main electrode layer projection 211. For example, a predetermined shape of insulating interlayer 4 can be obtained by exposure and development of photosensitive polyimide applied by a spin-coating method and the like. This is shown in FIG. 5D. Also, it is possible to form first insulating interlayer 4 by using not only photosensitive polyimide, but also non-photosensitive polyimide or organic resin material such as polymer resin or inorganic insulating material such as silicon oxide, applied by a coating method, a chemical vapor deposition method (CVD method) or a sputtering method, and obtaining a predetermined pattern through photolithography.

Figure 5E:
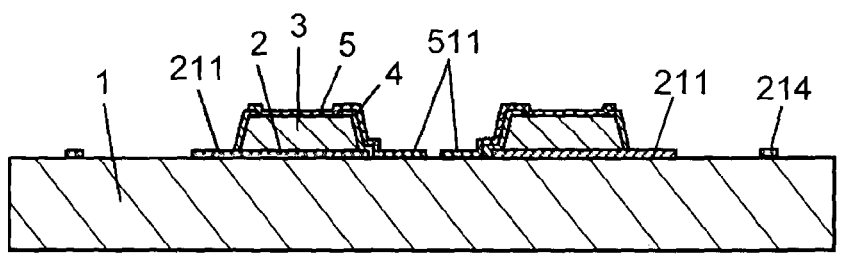
FIG. 5E is a block diagram of a step of forming a first opposed electrode layer during the manufacturing method of the first exemplary embodiment.

Next, as shown in FIG. 5E, first opposed electrode layer 5, being nearly the same in shape as first piezoelectric thin film 3, is formed. First opposed electrode layer 5 is partially arranged on first insulating interlayer 4 disposed at a side portion of first piezoelectric thin film 3 and extended to a surface of first substrate 1, thereby forming first opposed electrode projection 511. Since first opposed electrode projection 511 is formed at a side of piezoelectric thin film 3 opposite the side thereof at which first main electrode layer projection 211 is formed, and insulated by first insulating interlayer 4, the first electrode projection will never become short-circuited with first main electrode layer 2.

Figure 5F:
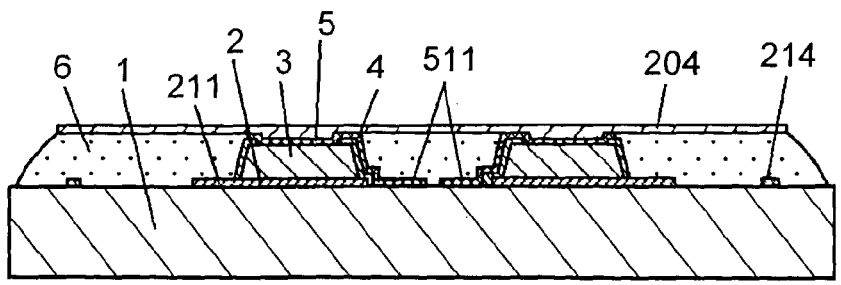
FIG. 5F is a block diagram of a step of forming a bonding layer during the manufacturing method of the first exemplary embodiment.

In this way, it is possible to obtain a configuration such that electrode layers are disposed on either side of first piezoelectric thin film 3, and that each of the electrode layers has a projection on first substrate 1. After forming such a configuration, insulating resin layer 6 having a thickness nearly equal to the distance to first opposed electrode layer 5, as shown in FIG. 5F, is formed on piezoelectric thin film 3. Further, an adhesive agent is applied over the entire surface of substrate 1, including insulating resin layer 6 and first opposed electrode layer 5, in order to form adhesive layer 204.

As first opposed electrode layer 5, a single metallic layer or alloy layer may be used provided that it has excellent conductivity and can be selectively etched. It is also possible to form multiple layers by laminating material, such as gold (Au), silver (Ag) and copper (Cu),.

As insulating resin layer 6, for example, it is possible to use a layer polyamidized by heating at 250° C., after applying a liquid preimide resin solution by a spinner, and drying at 120° C. Besides this, the insulating resin layer 6 can be formed by applying other organic polymer material, followed by heat-curing or photo-curing. As is seen in FIG. 5F, since insulating resin layer 6 comes into contact with both of first main electrode layer 2 and first opposed electrode layer 5, material used as the insulating resin layer is required to ensure sufficient electrical insulation and be capable of being etched into a predetermined shape. Also, insulating resin layer 6 is partially free from any particular problems even when formed on first opposed electrode layer 5.

As adhesive layer 204, a liquid preimide resin solution as that used for insulating resin layer 6 can be employed. Further, as adhesive layer 204, any material having no elasticity after adhering can be used. And, it is also preferable to use an epoxy or acrylic adhesive agent, and the like, or to use other organic resins having adhesion or photo-resist properties. In case an agent used is reactive like thermosetting epoxy resin, hardening will be suppressed during a manufacturing process, and therefore, it is preferable to execute separate application by applying a main agent on first substrate 1 and applying a hardener on second substrate 11.

Figure 6A:
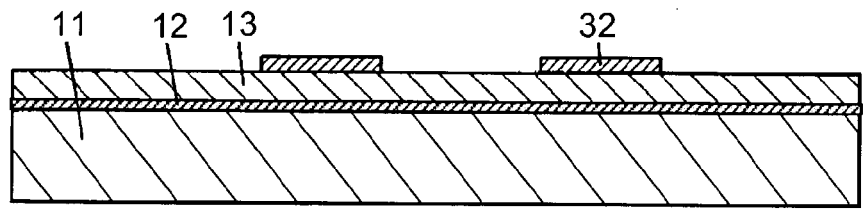
FIG. 6A is a sectional view of a configuration with a piezoelectric pattern resist formed on a second substrate during the manufacturing method of the first exemplary embodiment.

Next, film forming and processing on second substrate 11 will be described by using FIG. 6A to FIG. 6F. In FIG. 6A, second main electrode layer 12 and second piezoelectric thin film 13 are laminated onto second substrate 11, and then second piezoelectric pattern resist 32 is formed in order to process second piezoelectric thin film 13 into a predetermined shape.

Second main electrode layer 12 and second piezoelectric thin film 13 can be formed on second substrate 11, consisting of the same material as that of first substrate 1 shown in FIG. 5A to FIG. 5F, by using a similar material and film forming method as those of first main electrode layer 2 and first piezoelectric thin film 3, respectively. Second piezoelectric pattern resist 32 is shaped so as to have a mirror-image relationship with respect to first piezoelectric pattern resist 30. Further, etching second piezoelectric thin film 13 in the same way as that for first piezoelectric thin film 3 allows second piezoelectric thin film 13 to be formed into almost the same shape as first piezoelectric thin film 3.

Figure 6B:
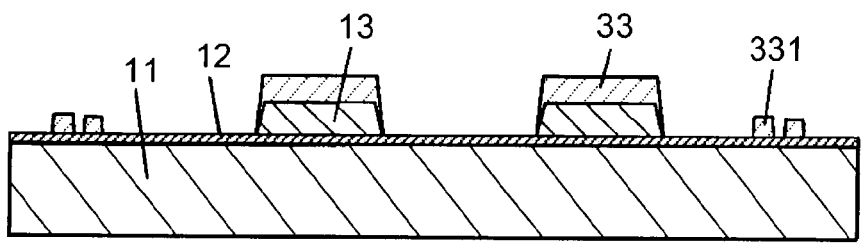
FIG. 6B is a sectional view of a configuration with a second main electrode pattern resist formed during the manufacturing method of the first exemplary embodiment.
Figure 6C:
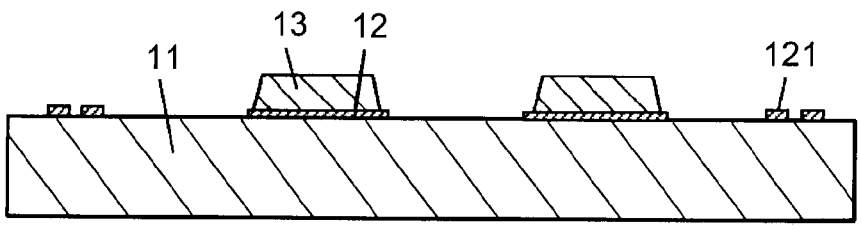
FIG. 6C is a sectional view of a configuration with the first main electrode layer etched during the manufacturing method of the first exemplary embodiment.

After etching second piezoelectric thin film 13 into a predetermined shape, second main electrode layer 12 is processed by photolithography and an etching process. A state of forming second main electrode pattern resist 33 is shown in FIG. 6B. Also, a shape of a resist after etching is shown in FIG. 6C. Second main electrode pattern resist 33, as is seen in FIG. 6B, is nearly the same or a little larger in size as compared with second piezoelectric thin film 13. Consequently, when second substrate 11 is removed by wet etching, it becomes easier to protect second piezoelectric thin film 13 from a chemical solution. Also, second marker resist 331 is formed in order to manufacture second marker 121 for opposing and positioning first substrate 1 and second substrate 11 relative to each other. When such a marker is not used for positioning of first substrate 1 and second substrate 11, the second marker resist 331 is not needed.

Processing on second substrate 11 is different from processing on first substrate 1 in that second main electrode layer 12, after etching is almost of the same shape as that of second piezoelectric thin film 13, and is also nearly of the same shape as that of first piezoelectric thin film 3.

Figure 6D:
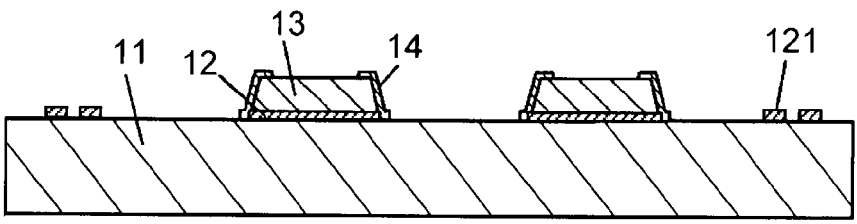
FIG. 6D is a sectional view of a configuration with a second insulating interlayer formed during the manufacturing method of the first exemplary embodiment.

Next, second insulating interlayer 14 is formed on a region of second piezoelectric thin film 13, except a region thereof where second opposed electrode layer 15 is to be formed. Second insulating interlayer 14 is desirable to be manufactured by using similar material and a similar manufacturing method as those of first insulating interlayer 4. A shape of second insulating interlayer 14 thus formed is shown in FIG. 6D.

Figure 6E:
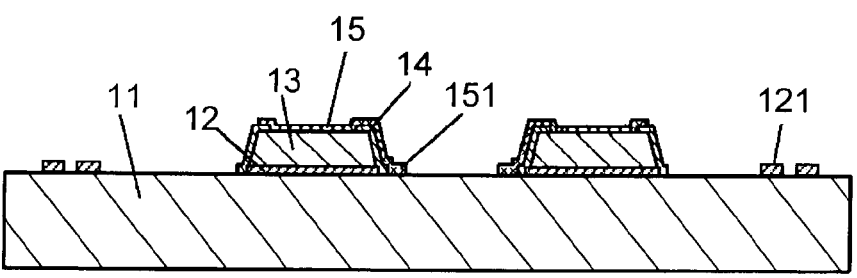
FIG. 6E is a sectional view of a configuration with a second opposed electrode layer formed during the manufacturing method of the first exemplary embodiment.

Subsequently, second opposed electrode layer 15, having nearly the same shape as that of second piezoelectric thin film 13, is formed on second piezoelectric thin film 13 as shown in FIG. 6E. Second opposed electrode layer 15 is further partially arranged on second insulating interlayer 14 at a side portion of second piezoelectric thin film 13 and extended to a surface of second substrate 11, thereby forming second opposed electrode layer projection 151.

In this way, it is possible to obtain a shape such that electrode layers are disposed on either side of second piezoelectric thin film 13, and that second opposed electrode layer 15 is extended to second substrate 11, thereby forming second opposed electrode layer projection 151. After forming a configuration like this, insulating resin layer 6, having a thickness nearly equal to the distance to second opposed electrode layer 15, is formed on piezoelectric thin film 13. Further, an adhesive agent is applied over the entire surface of the substrate 11, including insulating resin layer 6 and second opposed electrode layer 15 in order to form adhesive layer 205. This is shown in FIG. 6F.

As for second opposed electrode layer 15, insulating resin layer 6, and adhesive layer 205, the same materials as the materials used for processing on first substrate 1 can be used, and it is also possible to select from the materials mentioned above.

Since the insulating resin layers are formed on the first substrate and the second substrate according to such a manufacturing method, respectively, it is easy to check for defects such as bubbles in the insulating resin layers and application unevenness, and to easily reproduce in case of detected defects. Also, a spinner or the like can be used for forming the insulating resin layers, and therefore, no particular device is needed.

Figure 6F:
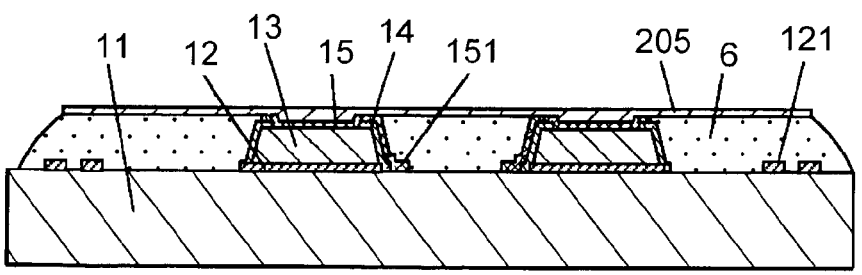
FIG. 6F is a sectional view of a configuration with an adhesive layer formed during the manufacturing method of the first exemplary embodiment.
Figure 7A:
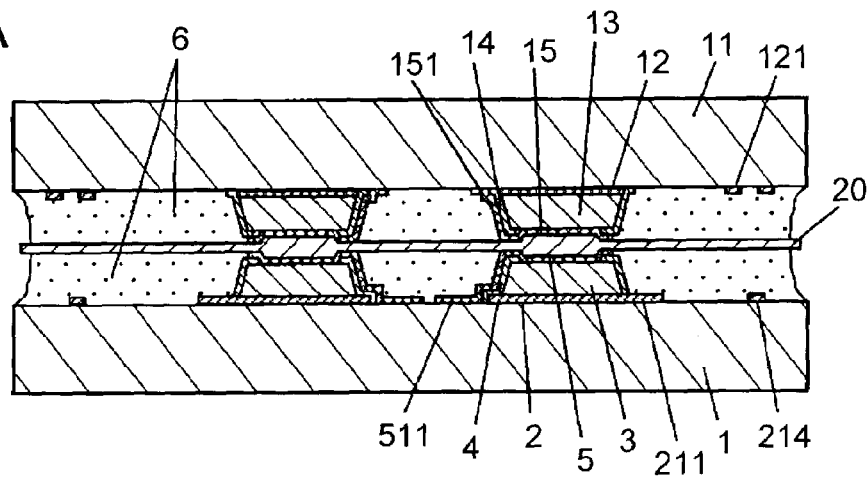
FIG. 7A is a block diagram of a step of bonding a first piezoelectric thin film to a second piezoelectric thin film during the manufacturing method of the first exemplary embodiment.

Steps of manufacturing a predetermined piezoelectric thin film element by bonding structures as shown in FIG. 5F and FIG. 6F are shown in FIG. 7A to FIG. 8B. In FIG. 7A, first piezoelectric thin film 3 and second piezoelectric thin film 13 are opposed and bonded to each other by adhesive layers 204, 205. In this case, adhesive layers 204, 205 are integrally mixed to become adhesive layer 20.

During bonding, positioning is executed by using first marker 214 and second marker 121 so that the piezoelectric thin films are accurately placed one upon another. Adhesive layer 20 is preferable to be formed either on first opposed electrode layer 5 or on second opposed electrode layer 15, in accordance with material characteristics of the layers. Polarization orientation of piezoelectric material formed on the substrates, preferably Mgo substrates, is perpendicular to respective substrate surfaces, so that polarization orientations in a thickness direction after bonding, are parallel but opposite to each other, whereby when an electric field is applied expansion and contraction in a planar direction of the layer may be parallel.

When an MgO substrate is used as first substrate 1 and second substrate 11, positioning can be executed by using a microscope because the MgO substrates are transparent. However, in the case of a non-transparent substrate, it is possible to employ a positioning method, for example, in that a mirror is fixed at a specific position and, after positioning respective substrates against the mirror, the mirror is removed and the substrates are brought closer to each other for bonding. Also, without using a positioning marker at all, positioning can be executed on the basis of an exterior shape of each substrate. Thus, piezoelectric thin films sandwiched between upper and lower electrode layers are bonded and laminated to manufacture integrally paired structures 501, 502.

After bonding in this way, only second substrate 11 is selectively removed. As a method of removing second substrates 1, etching, polishing, or etching after polishing up to a predetermined thickness can be employed. In case first substrate 1 and second substrate 11 are of the same material, it is preferable to etch the substrates after coating a surface of first substrate 1 with resin which is not attacked by a chemical solution used for etching.

Figure 7B:
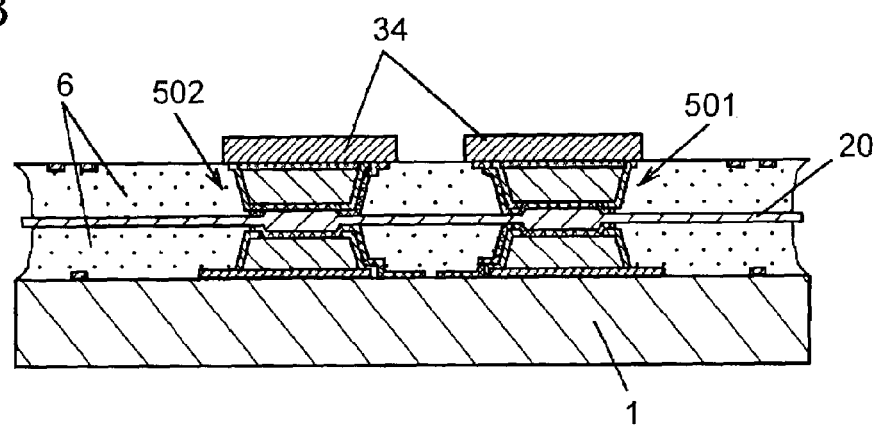
FIG. 7B is a block diagram of a step of forming an insulating resin layer pattern resist and etching the insulating resin layer and adhesive layer during the manufacturing method of the first exemplary embodiment.

When second substrate 11 is removed, structures 501, 502, being connected to each other by insulating resin layer 6 and adhesive layer 20, are exposed. To separate these structures 501, 502, insulating resin layer pattern resist 34 is formed as shown in FIG. 7B, and insulating resin layer 6 and adhesive layer 20 are etched with use of insulating resin layer pattern resist 34 as a mask.

Figure 7C:
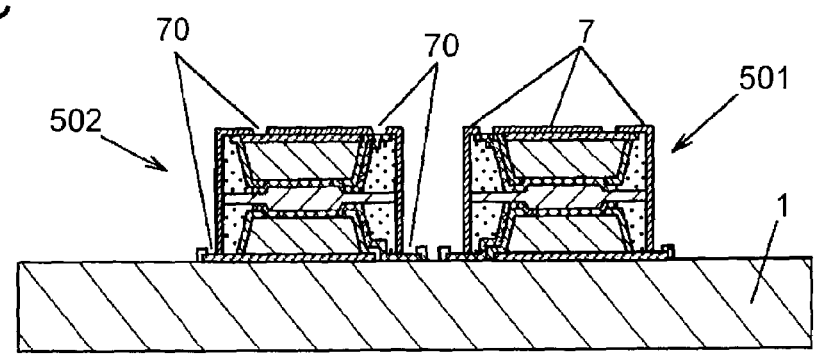
FIG. 7C is a block diagram of a step of forming an opening in each electrode layer and individually separating structure during the manufacturing method of the first exemplary embodiment.

Next, third insulating interlayer 7 is formed along an outer periphery of structures 501, 502, and also, opening 70 is formed at predetermined positions of first main electrode layer 2, second main electrode layer 12, first opposed electrode layer 5, and second opposed electrode layer 15. This is shown in FIG. 7C. As for third insulating interlayer 7, it is preferable to employ, for example, an inorganic insulating material such as photosensitive resin material, non-photosensitive resin material or a silicon oxide layer, which is used for semiconductors, to apply these materials by CVD or a sputtering process, and to form a pattern by a lithography process.

Figure 8A:
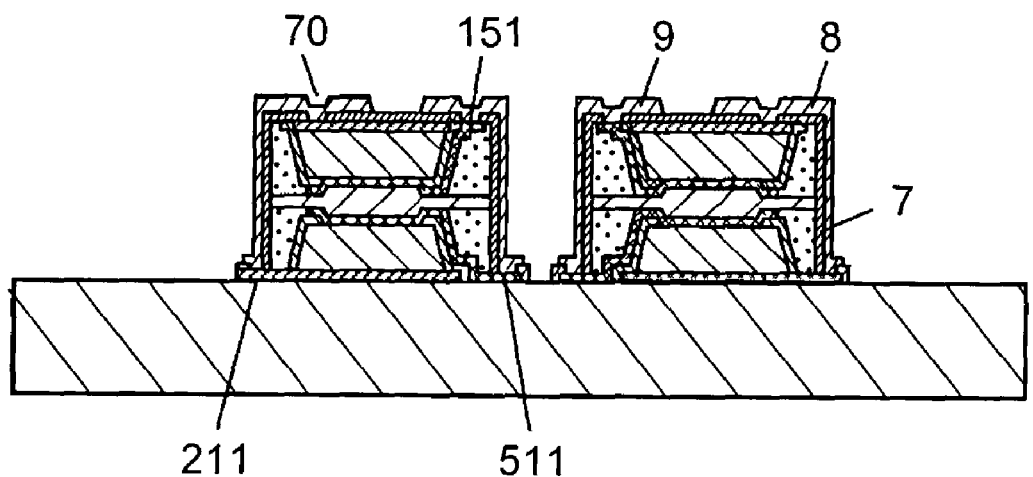
FIG. 8A is a block diagram of a step of forming connection wiring of each electrode during the manufacturing method of the first exemplary embodiment.

Subsequently, as shown in FIG. 8A, first connection wiring 8 for electrically connecting first main electrode layer 2 and second main electrode layer 12, and similarly, second connection wiring 9 for electrically connecting first opposed electrode layer 5 and second opposed electrode layer 15, are formed. Since connection wiring, as is seen in FIG. 8A, are formed along outer edges of the first and second piezoelectric thin films, an etching process is simple and yield is greatly improved.

Figure 8B:
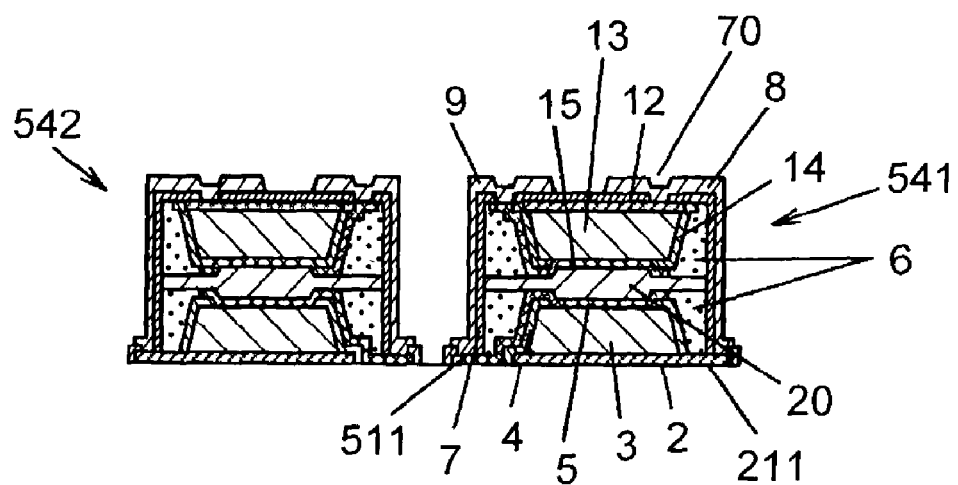
FIG. 8B is a block diagram of a step of removing a substrate and resin in order to form thin film piezoelectric elements during the manufacturing method of the first exemplary embodiment.

The entire surfaces of structures 501, 502, and the connection wiring formed in this way are covered with resin (not illustrated), first substrate 1 is removed by etching, and the resin is removed by dissolving such that a pair of piezoelectric thin film elements 541, 542 are formed. This is shown in FIG. 8B.

As described above, in the first exemplary embodiment, the piezoelectric thin film, main electrode layer and opposed electrode layer are etched into predetermined shapes on respective substrates. Accordingly, side etching, in particular, of the piezoelectric thin film is greatly reduced, and it is possible to remarkably reduce variations in shape after etching. Further, since the first and second connection wiring for electrical conduction between main electrode layers and between opposed electrode layers are formed at side portions that are outer edges of the piezoelectric thin films, it is not necessary to form via-holes and the like in the piezoelectric thin films.

As a result, nothing is deposited on side walls and short-circuiting trouble hardly occurs between the main electrode layers and the opposed electrode layers, respectively, thereby greatly improving yield. Moreover, since the connection wiring can be formed collectively, on the first substrate, it is possible to reduce variations of element characteristics and to enhance productivity.

Second Exemplary Embodiment

Main steps for description of a manufacturing method of a second exemplary embodiment will be described with reference to FIG. 9A to FIG. 12B. Also in the second exemplary embodiment, an actuator with a pair of thin film piezoelectric elements as shown in FIG. 1 and FIG. 2 is explained as an example. Elements corresponding to those in FIG. 1 to FIG. 8B are given same reference numerals, and as for materials and processes, the same ones can be employed as with the first exemplary embodiment. In FIG. 9A to FIG. 9D and FIG. 10A to FIG. 10D, steps of processing on first substrate 81 and second substrate 91 are respectively shown. Steps of processing, after affixing these two substrates to each other, are shown in FIG. 11A to FIG. 11B and FIG. 12A to FIG. 12B.

Figure 9A:
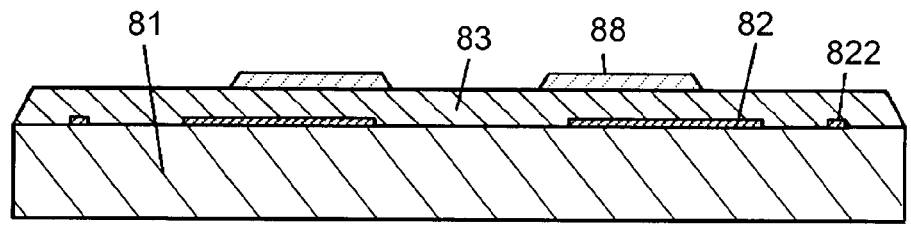
FIG. 9A is a block diagram of a step of forming first piezoelectric thin film pattern resists on a first substrate during a manufacturing method of a second exemplary embodiment of the present invention.

First main electrode layer 82 is formed on first substrate 81, and after etching into a predetermined shape, first piezoelectric thin film 83 is formed on substrate 81 and electrode layer 82. An overall shape of first main electrode layer 82 is nearly the same as that of first piezoelectric thin film 83 to be formed later, and a part thereof is projected from first piezoelectric thin film 83 to form first main electrode projection 821. When etching is performed, it is preferable to form first marker 822 to be used for affixing the substrates 81, 91 to each other, by using thin film used for first main electrode layer 82. Subsequently, first piezoelectric thin film pattern resist 88 for etching first piezoelectric thin film 83 into a predetermined shape is formed. This is shown in FIG. 9A.

Figure 9B:
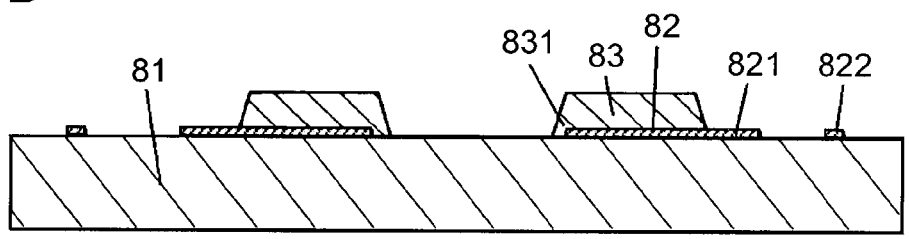
FIG. 9B is a block diagram of a step of forming a first piezoelectric thin film during the manufacturing method of the second exemplary embodiment.

Next, when first piezoelectric thin film 83 is etched according to first piezoelectric thin film pattern resist 88, first main electrode layer projection 821 of first main electrode layer 82 is exposed from first piezoelectric thin film 83, and at an opposite side thereof, first piezoelectric coating region 831 covered with first piezoelectric thin film 83 can be obtained, as shown in FIG. 9B.

Figure 9C:
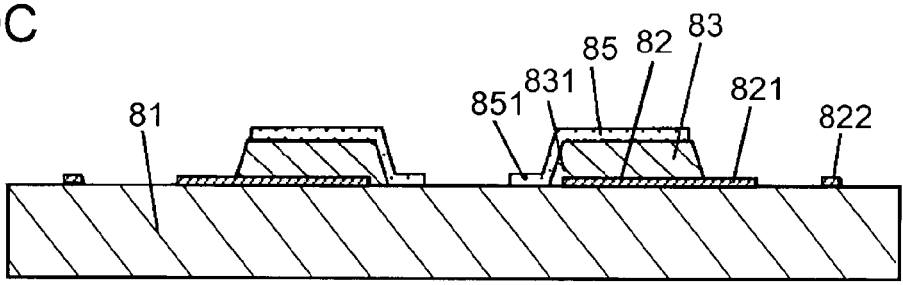
FIG. 9C is a block diagram of a step of forming a first opposed electrode layer during the manufacturing method of the second exemplary embodiment.

After forming such a configuration as described above, first opposed electrode layer 85 is formed on first piezoelectric thin film 83. As shown in FIG. 9C, formed is first opposed electrode layer 85 being nearly the same in shape as that of first piezoelectric thin film 83, and including first opposed electrode layer projection 851 extended to a surface of the first substrate 81 via first piezoelectric coating region 831. Subsequently, insulating resin layer 86 and adhesive layer 871 are formed as in the first exemplary embodiment.

Figure 10A:
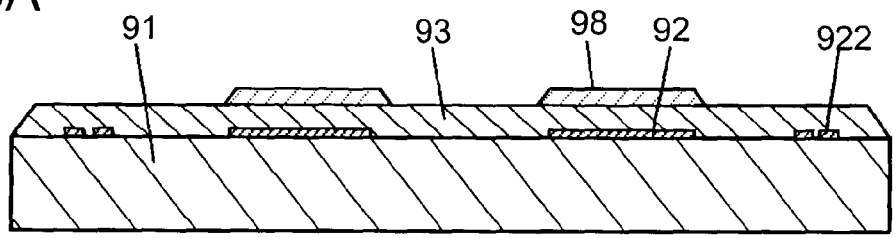
FIG. 10A is a block diagram of a step of forming a second piezoelectric thin film pattern resist on a second substrate during the manufacturing method of the second exemplary embodiment.

Next, film forming and processing on second substrate 91 are described with reference to FIG. 10A to FIG. 10D. Second main electrode layer 92 is formed on second substrate 91, and a predetermined pattern is formed thereon. In that case, second marker 922 is also formed, which marker is used for positioning when first substrate 81 and second substrate 91 are affixed to each other. Second main electrode layer 92 is not to be provided with a projection, unlike first main electrode layer 82, and is entirely covered with second piezoelectric thin film 93. Second piezoelectric thin film 93 is formed on second main electrode layer 92 having such a shape, and second piezoelectric thin film pattern resist 98, for etching second piezoelectric thin film 93 into a predetermined shape, is formed. This is shown in FIG. 10A.

Figure 10B:
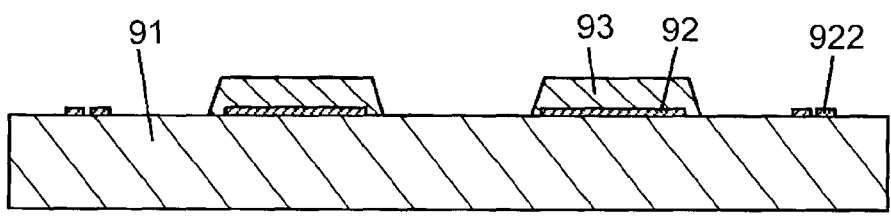
FIG. 10B is a block diagram of a step of forming a second piezoelectric thin film during the manufacturing method of the second exemplary embodiment.

When second piezoelectric thin film 93 is etched in accordance with second piezoelectric thin film pattern resist 98, second main electrode layer 92 is entirely covered with second piezoelectric thin film 93. This is shown in FIG. 10B.

Figure 9D:
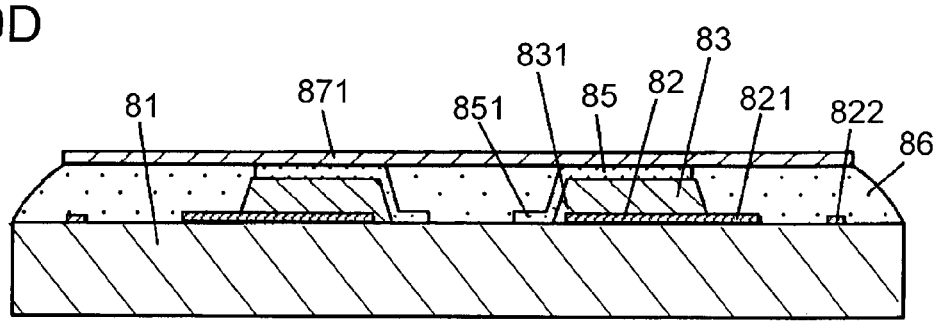
FIG. 9D is a block diagram of a step of similarly forming an insulating resin layer and adhesive layer during the manufacturing method of the second exemplary embodiment.
Figure 10C:
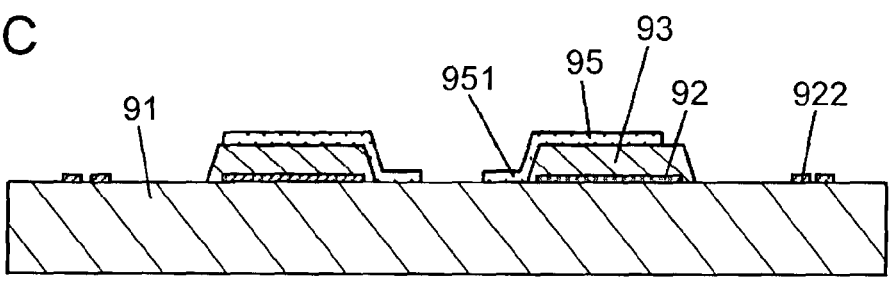
FIG. 10C is a block diagram of a step of forming a second opposed electrode layer during the manufacturing method of the second exemplary embodiment.
Figure 10D:
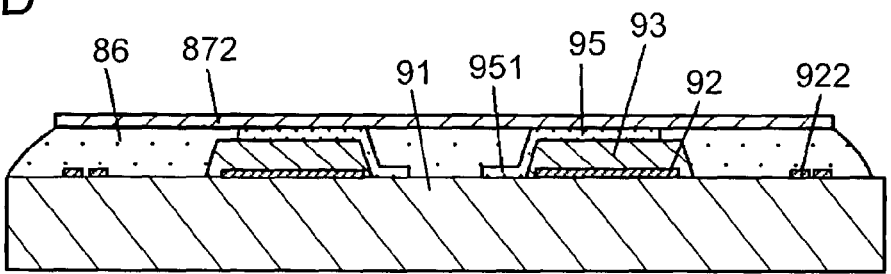
FIG. 10D is a block diagram of a step of similarly forming an insulating resin layer and adhesive layer during the manufacturing method of the second exemplary embodiment.

Next, second opposed electrode layer 95 is formed on second piezoelectric thin film 93. As shown in FIG. 10C, second opposed electrode layer 95 is nearly the same shape as second piezoelectric thin film 93, and extended to a surface of second substrate 91 via a side portion of second piezoelectric thin film 93 to form second opposed electrode layer projection 951. Second opposed electrode layer projection 951 is formed at a position corresponding to first opposed electrode layer projection 851 with first substrate 81 and second substrate 91 affixed to each other, and is shorter than first opposed electrode layer projection 851. Subsequently, as shown in FIG. 10D, insulating resin layer 86 and adhesive layer 872 are formed as shown in FIG. 9D.

In this way, the steps of processing on first substrate 81 and second substrate 91 are completed. As is obvious from the above description, the manufacturing method of the second exemplary embodiment is different from the manufacturing method of the first exemplary embodiment with respect to film forming of first main electrode layer 82 and first piezoelectric thin film 83, pattern making, and a shape of the pattern formed. In addition, there is a difference from the first exemplary embodiment in that first insulating interlayer 4 and second insulating interlayer 14 are not needed.

Figure 11A:
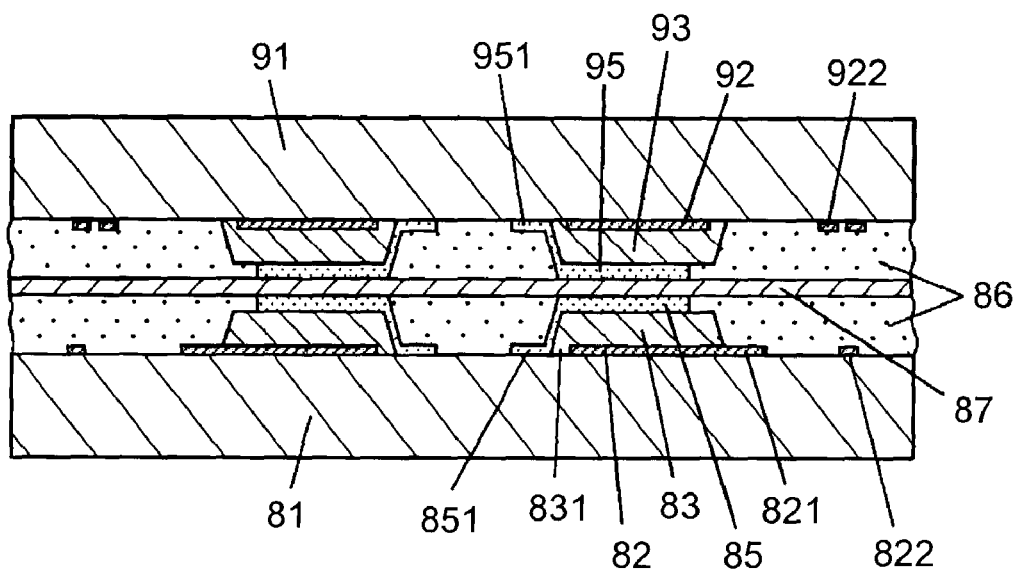
FIG. 11A is a block diagram of a step of opposing and bonding a first opposed electrode layer and the second opposed electrode layer to each other during the manufacturing method of the second exemplary embodiment.

Steps after completing the step of processing on each of substrates 81, 91 are shown in FIG. 11A to FIG. 12B. First opposed electrode layer 85 and second opposed electrode layer 95, as shown in FIG. 11A, are opposed to each other and bonded by adhesive layers 871, 872 after positioning the substrates 81, 91 by using first marker 822 and second marker 922. Adhesive layers 871, 872, when bonded, are integrated into adhesive layer 87, thereby forming structures 111, 112 with the piezoelectric thin films integrated.

Figure 11B:
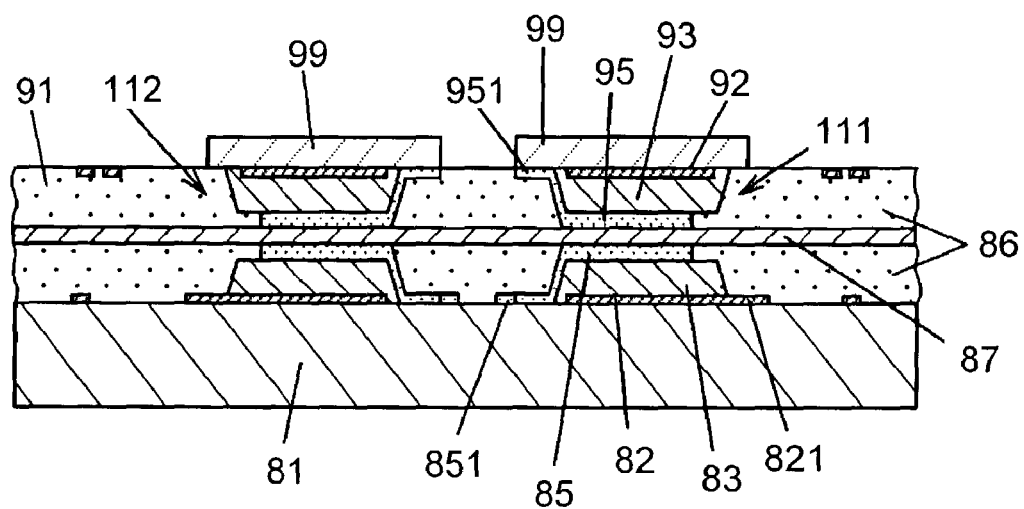
FIG. 11B is a block diagram of forming an insulating resin layer pattern resist to individually separate a structure during the manufacturing method of the second exemplary embodiment.

Next, only second substrate 91 is selectively removed. Thus, structures 111, 112 are exposed in a state of being connected by insulating resin layer 86 and adhesive layer 87. Insulating resin layer pattern resist 99 is formed in order to separate structures 111, 112. This is shown in FIG. 11B.

Third insulating interlayer 97 is formed on a surface of second main electrode layer 92, except over an opening thereof, by etching insulating resin layer 86 and adhesive layer 87.Then, connection wiring 101, 102 is formed for forming an electrical connection between first main electrode layer projection 821 and the opening of second main electrode layer 92, and between first opposed electrode layer projection 851 and second opposed electrode layer projection 951. This is shown in FIG. 12A.

Figure 12A:
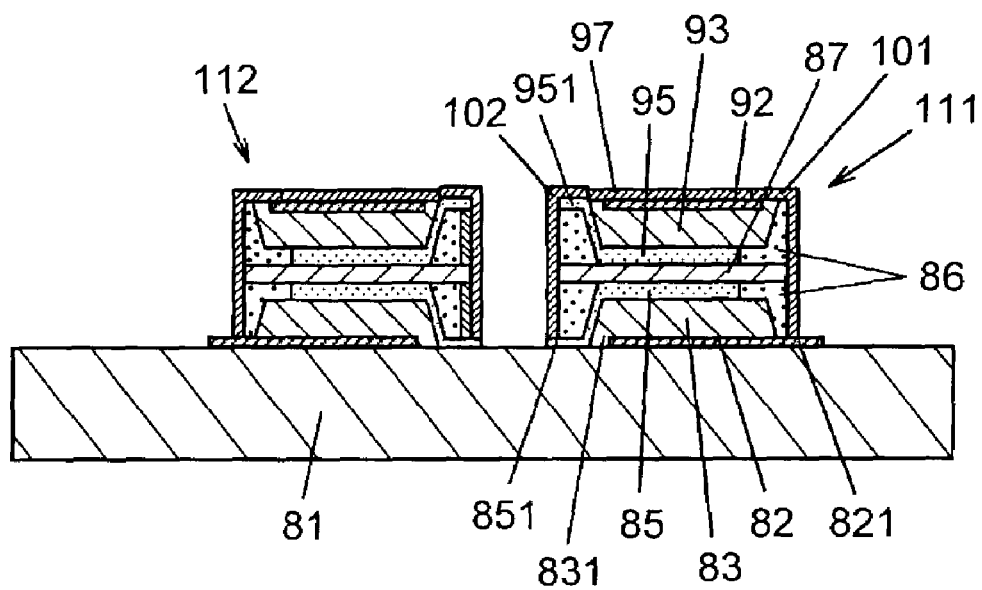
FIG. 12A is a block diagram of forming connection wiring for each electrode during the manufacturing method of the second exemplary embodiment.
Figure 12B:
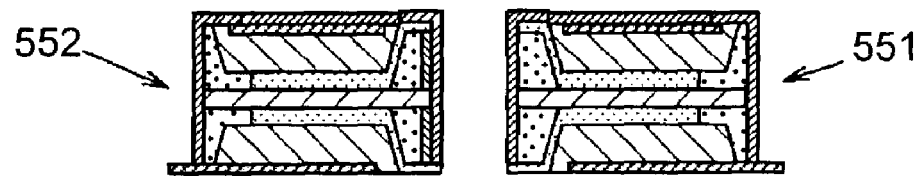
FIG. 12B is a block diagram of a step of individually separating structure during the manufacturing method of the second exemplary embodiment.

Finally, as shown in FIG. 12B, only first substrate 81 is selectively removed to provide thin film piezoelectric elements 551, 552.

Third insulating interlayer 97 is not indispensable for the present exemplary embodiment. Since connection wiring 101, 102 can also be formed so that second main electrode layer 92 and second opposed electrode layer 95 are not short-circuited, it would then be unnecessary to provide the third insulating interlayer. Also, as with the first exemplary embodiment, it is preferable to form third insulating interlayer 97 so as to cover a part of first main electrode layer projection 821, first opposed electrode layer projection 851, and insulating resin layer 86. Forming the third insulating layer like this will improve environmental resistance.

As is seen in FIG. 12A, since the main electrode layers and the opposed electrode layers are respectively connected with each other, etching of the piezoelectric thin films is not needed, and therefore, there is no sidewall deposit at all resulting from etching. Also, unlike the first exemplary embodiment, it is not necessary to form first insulating interlayer 4 and second insulating interlayer 14, and consequently, the manufacturing process is simplified and yield may be improved.

In the present exemplary embodiment, the insulating resin layer and adhesive layer are formed on both substrates, and the adhesive layer is used for bonding, but the present invention is not limited to this configuration. That is, it is also possible to employ a method of filling an insulating resin layer into space formed when an electrode layer, that can be alloyed by heating, is formed on each of the first opposed electrode layer and the second opposed electrode layer, and the layers are opposed so as to be in tight contact with each other and alloyed by heating.

Third Exemplary Embodiment

Main steps for description of a manufacturing method of a third exemplary embodiment of the present invention are shown in FIG. 13A to FIG. 14C. Also in the third exemplary embodiment, an actuator with paired thin film piezoelectric elements as shown in FIG. 1 and FIG. 2 is described as an example. Elements corresponding to those in FIG. 1 to FIG. 10D are given same reference numerals.

The manufacturing method of the present exemplary embodiment is different from that of the first exemplary embodiment with respect to material and configuration, a bonding method for piezoelectric thin films, and a method of forming an insulating resin layer. Steps different from those of the first exemplary embodiment are mainly explained in the following.

Figure 13A:
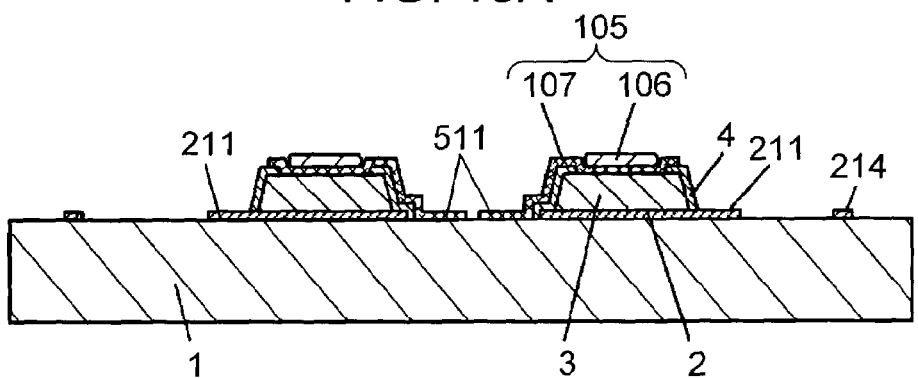
FIG. 13A is a sectional view of structure formed on a first substrate during a manufacturing method of a third exemplary embodiment of the present invention.
Figure 13B:
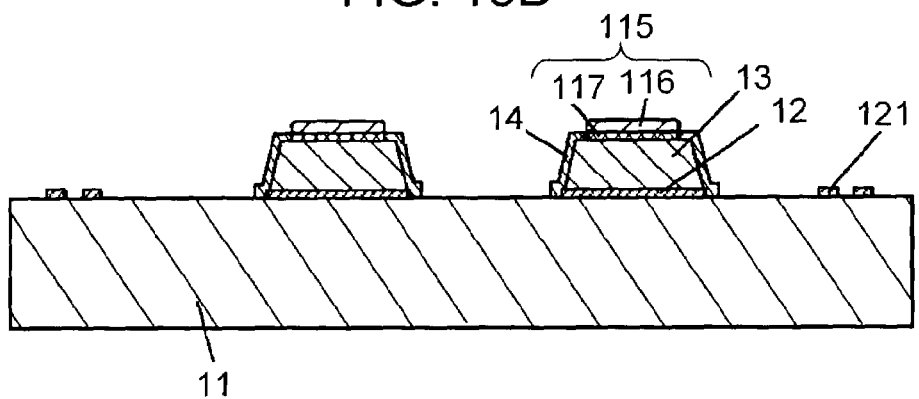
FIG. 13B is a sectional view of structure formed on a second substrate during the manufacturing method of the third exemplary embodiment.

In FIG. 13A, first main electrode layer 2, first piezoelectric thin film 3, and first opposed electrode layer 105 are formed on first substrate 1, which electrode layers and thin film are formed into predetermined shapes. Also, as shown in FIG. 13B, second main electrode layer 12, second piezoelectric thin film 13 and second opposed electrode layer 115 are formed on second substrate 11, which electrode layers and thin film are formed into predetermined shapes. First opposed electrode layer 105 and second opposed electrode layer 115 are formed of multiple layers on piezoelectric thin films 3 and 13, respectively. When one of upper layers 106, 116 is made of gold (Au), for example, the other upper layer is a thin film made of tin (Sn). That is, material of the upper layers is selected such that the upper layers when heated in a state of being in tight contact with each other are alloyed and bonded at a relatively low temperature. For example, in the case of Au and Sn, when heated at 377° C., these materials are bonded due to a generated eutectic reaction. As such materials, besides a combination of Au and Sn as mentioned above, it is also possible to adopt a combination of materials selected from a first group consisting of Au, Ag, and Cu, and from a second group consisting of Sn and cadmium (Cd).

Lower layers 107, 117 of the opposed electrode layers are preferably electrically conductive, which layers can be formed by properly selecting, for example, a metal layer such as Cu and aluminum (Al) or an alloy layer such as nichrome.

Further, upper layers 106, 116 of the opposed electrode layers are at least thick enough to project from first insulating interlayer 4 or second insulating interlayer 14.

Also, as shown in FIG. 13B, second opposed electrode layer 115 is formed only on second piezoelectric thin film 13.

Figure 13C:
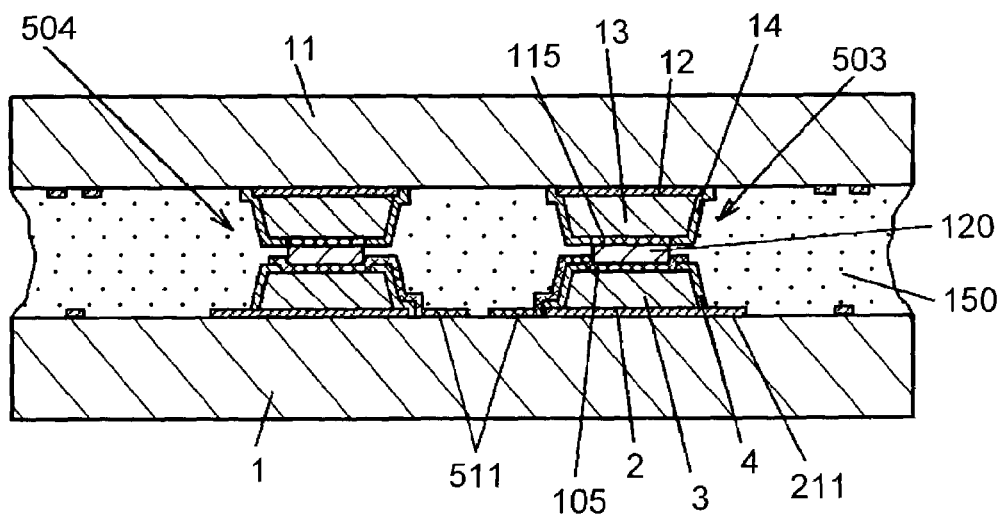
FIG. 13C is a block diagram of a step of bonding the structure on the first substrate to the structure on the second substrate during the manufacturing method of the third exemplary embodiment.

As shown in FIG. 13C, first opposed electrode layer 105 and second opposed electrode layer 115 are opposed to each other and in tight contact with each other, and heated at about 380° C. Because of this heating, a eutectic reaction takes place between Au and Sn of upper layers 106, 116 such that these upper layers are integrated into adhesive layer 120.

Also, in such a manufacturing method, the adhesive layer for bonding the first opposed electrode layer to the second opposed electrode layer is electrically conductive. With this configuration, since the first opposed electrode layer and the second opposed electrode layer are bonded and electrically connected to each other, it is not necessary to form connection wiring after bonding.

Due to such configuration, a metal layer for bonding can be formed on a surface layer simultaneously with formation of the first opposed electrode layer and the second opposed electrode layer. As a result, it is not necessary to form any adhesive layer, and accurate positioning of the first substrate and the second substrate relative to each other is not needed because positioning is executed in a self-aligning fashion when the metals of the upper layer melt to be alloyed.

By executing such bonding, it is possible to obtain structures 503, 504 in which the first piezoelectric thin film 3 is integrated with the second piezoelectric thin film 13. An air gap provided by structures 503, 504 is created between first substrate 1 and second substrate 11. The air gap is filled with resin to form insulating resin layer 150. A state of being filled with insulating resin layer 150 is shown in FIG. 13C. A thickness of structures 503, 504 is about 10 $\mu$m, and it is required to fill resin into the air gap to a thickness of about 10 $\mu$m between the two substrates, but selection of a resin having appropriate viscosity allows the resin to be penetrated due to capillary phenomenon. Also, as in a method of manufacturing a liquid crystal panel, it is preferable to forcibly fill resin by a vacuum injection method. For example, a two-liquid epoxy resin of high-temperature hardening type can be used as the insulating resin 150. In this case, when the epoxy resin is filled between the two substrates at 80° C., the epoxy resin is not excessively hardened and resin viscosity is low enough for filling the air gap between the substrates, thereby making it possible to readily fill the resin. After filling the resin, when heating and hardening are completed at 150° C. for two hours, the entire surface of structures 503, 504 are covered with insulating resin layer 150 except for a surface bonded to first substrate 1 and second substrate 11.

After making structures 503, 504 protected with insulating resin layer 150, second substrate 11 is removed by etching. Since structures 503, 504 are completely protected by insulating resin layer 150, an etching solution will never penetrate therein, and therefore, structures 503, 504 will never become deteriorated due to the etching solution. For a method of removing second substrate 11 by etching, the same method as described for the first exemplary embodiment can be employed. When second substrate 11 is removed, structures 503, 504, in a state of being connected to each other by the insulating resin layer 150, are exposed.

Figure 14A:
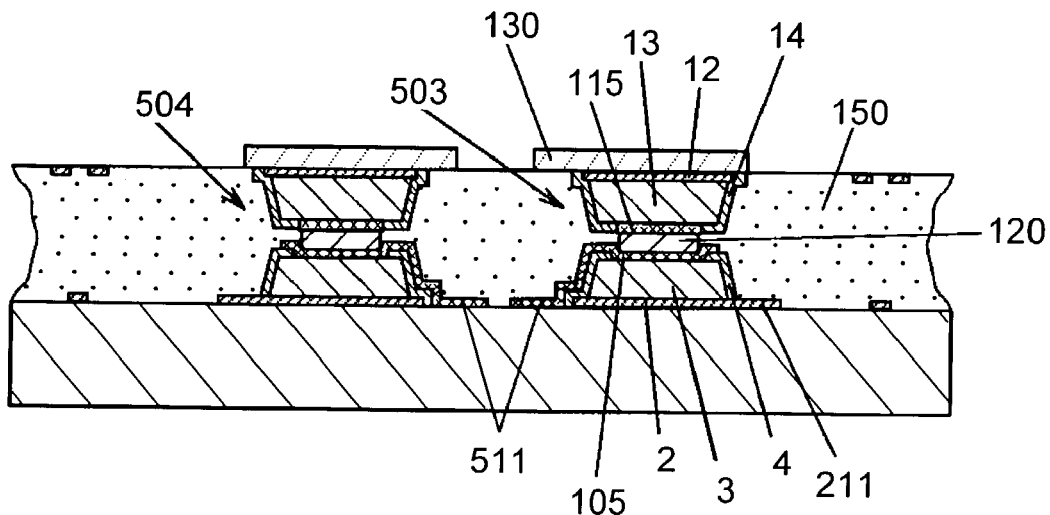
FIG. 14A is a block diagram of a step of forming an insulating resin layer pattern resist to individually separate each structure during the manufacturing method of the third exemplary embodiment.

Next, insulating resin layer 150 is etched to separate a plurality of structures 503, 504, and simultaneously, connection electrode portions for connecting each structure to external equipment are formed. For etching insulating resin layer 150, it is preferable to form insulating resin layer pattern resist 130 for etching in the same way as for the first exemplary embodiment. This is shown in FIG. 14A. In this case, unlike the manufacturing method of the first exemplary embodiment, etching only insulating resin layer 150 is sufficient, and thus etching conditions are simpler in the present exemplary embodiment. Also, structures 503, 504 are protected only by insulating resin layer 150 after etching, and therefore, even during use as thin film piezoelectric elements, moisture resistance is excellent and piezoelectric properties are less deteriorated.

Figure 14B:
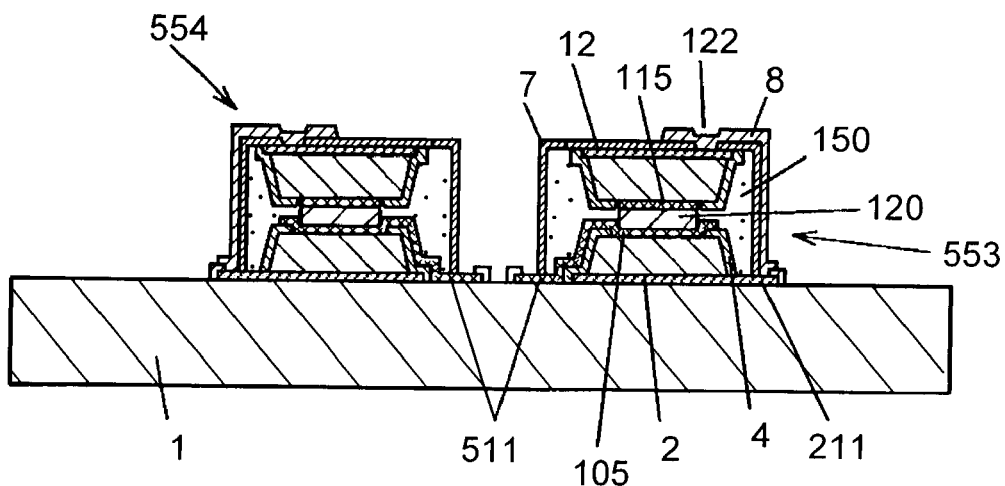
FIG. 14B is a block diagram of a step of forming the connection wiring for each electrode during the manufacturing method of the third exemplary embodiment.

As shown in FIGS. 14A and 14B, when insulating resin layer 150 is removed by etching, a part of first main electrode layer projection 211 on first substrate 1, and first opposed electrode layer projection 511 are exposed. Next, third insulating interlayer 7, for covering second main electrode layer 12, is formed, and a predetermined portion of insulating interlayer 7 is etched to make opening 122 in second main electrode layer 12. Third insulating interlayer 7 is preferable to be formed by using photosensitive polyamide as mentioned with regard to the first exemplary embodiment. It is also preferable to form the insulating interlayer 7 so as to cover insulating resin layer 150 and be on second main electrode layer 12.

Next, opening 122 provided in second main electrode layer 12 is electrically connected to first main electrode layer projection 211 of first main electrode layer 2 by using first connection wiring 8. Since first opposed electrode layer 105 and second opposed electrode layer 115 are already electrically connected by adhesive layer 120, it is sufficient to connect first opposed electrode layer projection 511 to a connection electrode pad. This is shown in FIG. 14B.

Figure 14C:
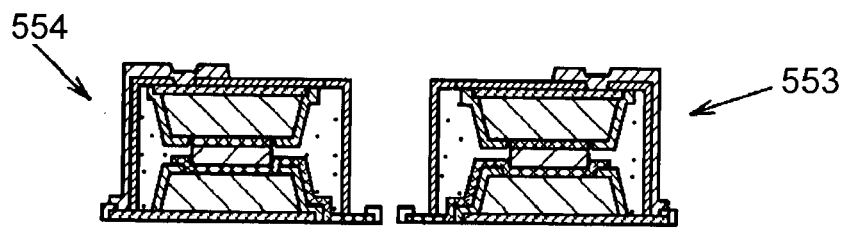
FIG. 14C is a block diagram of a step of individually separating each structure during the manufacturing method of the third exemplary embodiment.

Surfaces of thin film piezoelectric elements 553, 554 thus formed are protected by resin (not illustrated) such as wax, and thereafter, the first substrate 1 is removed by etching. Further, the resin such as wax sticking to a surface of thin film piezoelectric elements 553, 554 is dissolved and removed, such that thin film piezoelectric elements 553, 554, in a state of being completely separated from the substrate 1 are obtained. This is shown in FIG. 14C.

During the above manufacturing method, it is not necessary to form the first insulating interlayer and the second insulating interlayer as in the first exemplary embodiment, and thus the manufacturing method is simplified. Also, third insulating interlayer 7 is not needed, provided that second main electrode layer 12 has environmental resistance, and therefore, the manufacturing method may be further simplified. Also, since an outer periphery of structures 503, 504, with first piezoelectric thin film 3 and second piezoelectric thin film 13 opposed to each other and tightly bonded to each other, is covered only with insulating resin layer 150, there exists no bonding boundary or the like, and resistance to chemical solution and environmental resistance will be greatly enhanced.

During the manufacturing method of the present exemplary embodiment, the first opposed electrode layer and the second opposed electrode layer are alloyed for bonding, but such bonding is not to be so limited. For example, it is also possible to employ a conventional soldering method or a bonding method using a conductive adhesive agent containing silver particles and the like. By using such a bonding method, the first opposed electrode layer and the second opposed electrode layer can be simultaneously bonded and electrically connected to each other by using only a conductive resin, and therefore, the manufacturing method may be simplified. When the conductive resin layer is to be formed, it is possible to form this resin layer on one or both of the opposed electrode layers. Further, it is not always necessary to form the conductive resin layer over the entire surface of the opposed electrode layer, provided that electrical conducting and bonding requirements are satisfied., It is also possible to solder only one of the opposed electrode layers or both of the opposed electrode layers. By using such a soldering method, it is possible to prevent warp or bending upon expansion and contraction of the piezoelectric elements. Also, when the first and second opposed electrode layers are electrically connected to each other by an adhesive layer, it is not necessary to form connection wiring on a side portion of the piezoelectric thin films, and thus the manufacturing method may be simplified.

Fourth Exemplary Embodiment

Figure 15A:
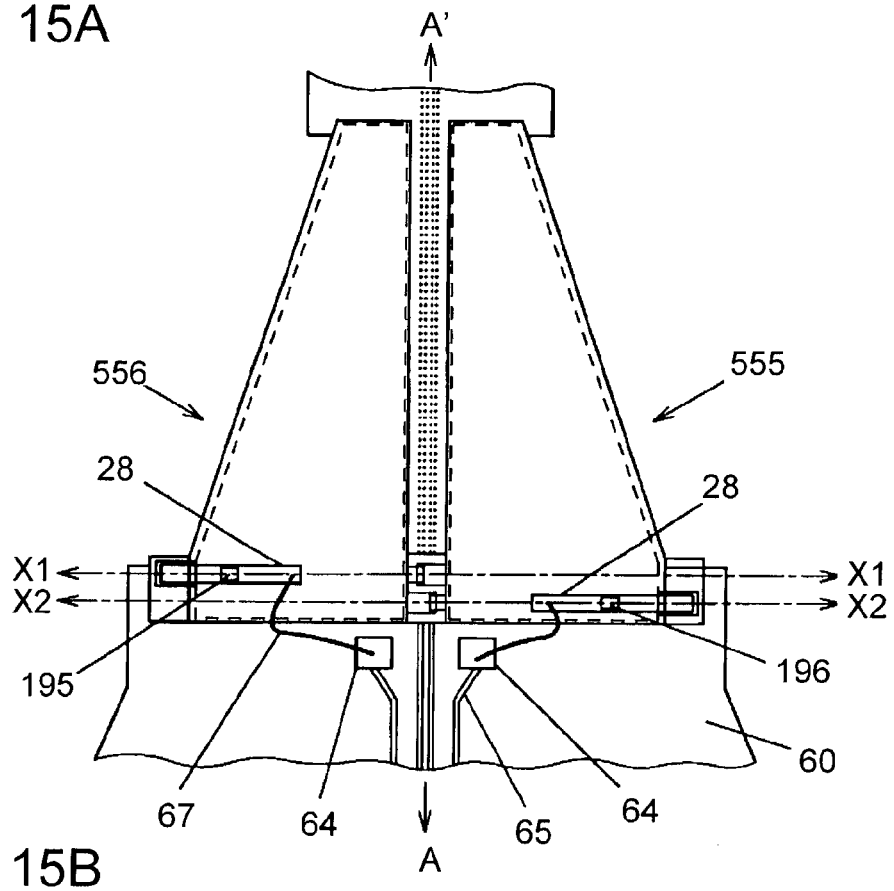
FIG. 15A is a plan view showing a configuration of an actuator with only two connection electrode pads extending from a pair of thin film piezoelectric elements of the present invention.
Figure 15B:
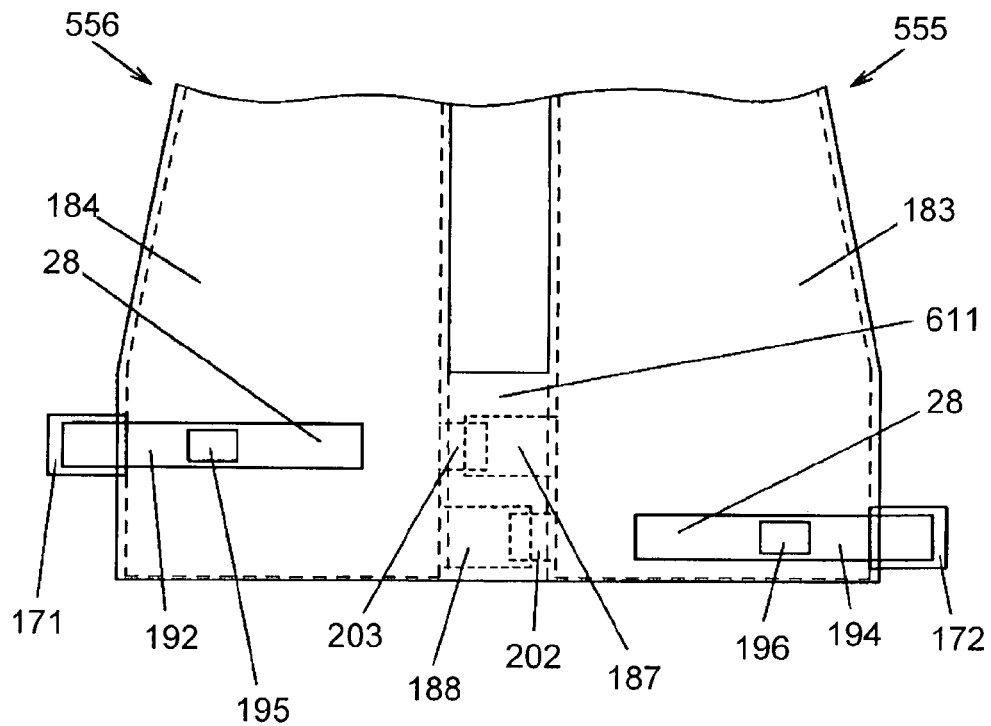
FIG. 15B is an enlarged plan view of a connection wiring portion of the actuator of FIG. 15A.

In a fourth exemplary embodiment, an actuator with thin film piezoelectric elements paired and integrated, and its manufacturing method will be described. FIG. 15A is a plan view showing an actuator of the present exemplary embodiment in a state of being mounted on flexure 60. FIG. 15B is an enlarged view of a wiring connection portion between a main electrode layer and an opposed electrode layer. The actuator of the present exemplary embodiment has features as follows. A pair of thin film piezoelectric elements 555, 556 are integrated by insulating resin layer 611 at a gap between the thin film piezoelectric elements close to connection electrode pads 28. Further, electrode layers of these two thin film piezoelectric elements 555, 556 are electrically connected to each other by connection wiring, and only two connection electrode pads 28 are used for connection to piezoelectric electrode pads 64 of flexure 60. As shown in FIG. 15A, right thin film piezoelectric element (hereafter called element A) 555 and left thin film piezoelectric element (hereafter called element B) 556 are in a mirror symmetrical relationship with respect to the A–A' line, except for wiring configurations, and have a structure similar to that of the first exemplary embodiment. In the present exemplary embodiment, since a special feature is the wiring configurations between the main electrode layer and the opposed electrode layer in each of element A (555) and element B (556), structure of the wiring configurations will be mainly explained.

The wiring configurations are described in accordance with FIG. 15A and FIG. 15B, and process diagrams shown in FIG. 16A to FIG. 20B to be described later.

At element A (555), through opening 196 disposed in third insulating interlayer 190, second main electrode layer 181 of element A (555) (hereafter called main electrode A2) and first main electrode layer projection 172 of element A (555) (hereafter called main projection electrode A1), projected at a side of a piezoelectric thin film, are electrically connected to each other by connection wiring 194 arranged on an insulating resin layer at the side of the piezoelectric thin film. Also, at element B (556), through opening 195 disposed in third insulating interlayer 190, second main electrode layer 182 of element B (556) (hereafter called main electrode B2) and first main electrode projection 171 of element B (556) (hereafter called main projection electrode B1) projected at a side of another piezoelectric thin film are electrically connected to each other by connection wiring 192 similarly arranged at the side of this piezoelectric thin film.

Further, at a gap between element A (555) and element B (556), first opposed electrode layer 167 of element A (555) (hereafter called opposed electrode A1) and first main electrode layer 162 of element B (556) (hereafter called main electrode B1), second opposed electrode layer 187 of element A (555) (hereafter called opposed electrode A2) and main electrode B2 (182), first opposed electrode layer 168 of element B (556) (hereafter called opposed element B1) and first main electrode layer 161 of element A (555) (hereafter called main electrode A1), and second opposed electrode layer 188 of element B (556) (hereafter called opposed electrode B2) and main electrode A2 (181) are electrically connected to each other by extended projection electrode layers, respectively.

By using such wiring configurations, main electrode A1 (161), main electrode A2 (181), opposed electrode B1 (168), and opposed electrode B2 (188) are electrically connected to each other. Also, an actuator with main electrode B1 (162), main electrode B2 (182), opposed electrode A1 (167), and opposed electrode A2 (187) electrically connected to each other can be obtained. Accordingly, even in case where only two pads are used for connecting the piezoelectric elements to flexure 60, voltages applied to element A (555) and element B (556) are opposite relative to each other, and it is thus possible to configure the piezoelectric elements so that one is expanded while the other is contracted.

Figure 16A:
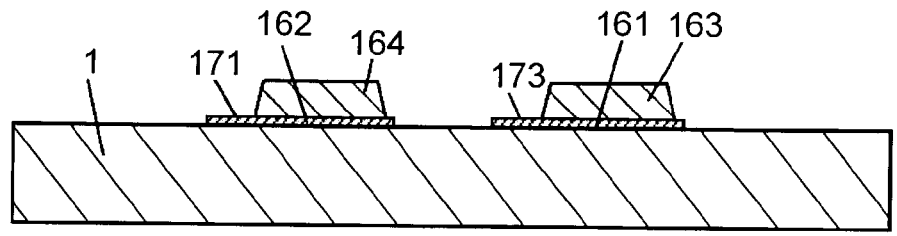
FIG. 16A is a block diagram of a step of forming main projected electrodes at the X1—X1 section of FIG. 15A during a manufacturing method of a fourth exemplary embodiment of the present invention.
Figure 16B:
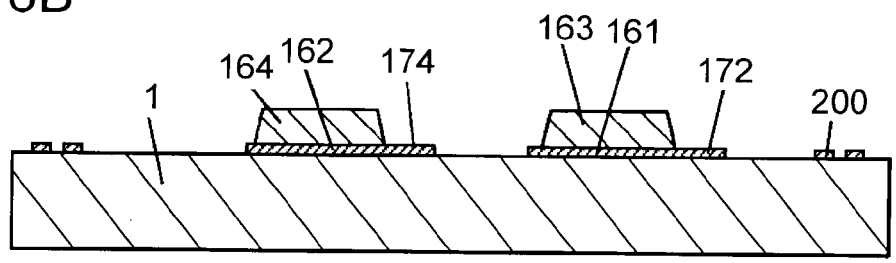
FIG. 16B is a block diagram of a step of forming main projected electrodes at the X2—X2 section of FIG. 15A during the manufacturing method of the fourth exemplary embodiment.
Figure 16C:
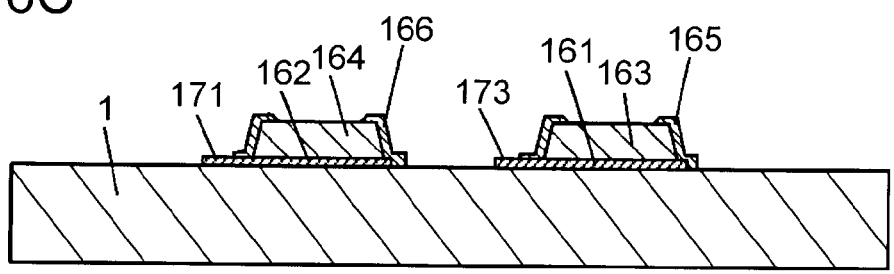
FIG. 16C is a block diagram of a step of forming an insulating interlayer at the X1—X1 section of FIG. 15A during the manufacturing method of the fourth exemplary embodiment.
Figure 16D:
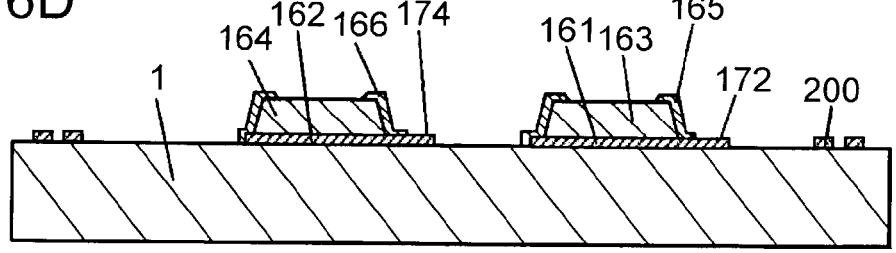
FIG. 16D is a block diagram of a step of forming an insulating interlayer at the X2—X2 section of the manufacturing method of the fourth exemplary embodiment.

Manufacturing processes will be described in the following, mainly referring to the wiring configurations of the actuator. FIG. 16A to FIG. 20B show a process flow based on the wiring configurations. FIG. 16A and FIG. 16C are sectional views along the X1—X1 line of FIG. 15A, and FIG. 16B and FIG. 16D are sectional views along the X2—X2 line of FIG. 15A. Elements corresponding to elements shown in FIG. 1 to FIG. 8B are given same reference numerals.

FIG. 16A to FIG. 16D show film forming on substrate 1 and its processing steps.

As shown in FIG. 16A and FIG. 16B, main electrode A1 (161) and main electrode B1 (162), which are first main electrode layers, and first piezoelectric thin films 163, 164 are formed on first substrate 1, which layers and films are respectively formed into predetermined shapes. That is, main electrode A1 (161) and main electrode B1 (162) are respectively provided with main projection electrode A1 (173) and main projection electrode B1 (171) at a left-hand side of FIG. 15A at the X1—X1 section, and also provided with main projection electrode A1 (172) and main projection electrode B1 (174) at a right-hand side of FIG. 15A at the X2—X2 section.

A configuration like this can be easily obtained by using a process similar to that of the first exemplary embodiment, by changing only a shape of a mask used in a photolithography process. Or, such a configuration can also be easily obtained by changing the mask, and using a process similar to that of the secondary exemplary embodiment. When main electrode A1 (161) and main electrode B1 (162) are etched into predetermined shapes, it is preferable to simultaneously manufacture first marker 200, as with the first exemplary embodiment. First marker 200 is not needed when positioning is executed by another method as is described with regard to the first exemplary embodiment.

Figure 17A:
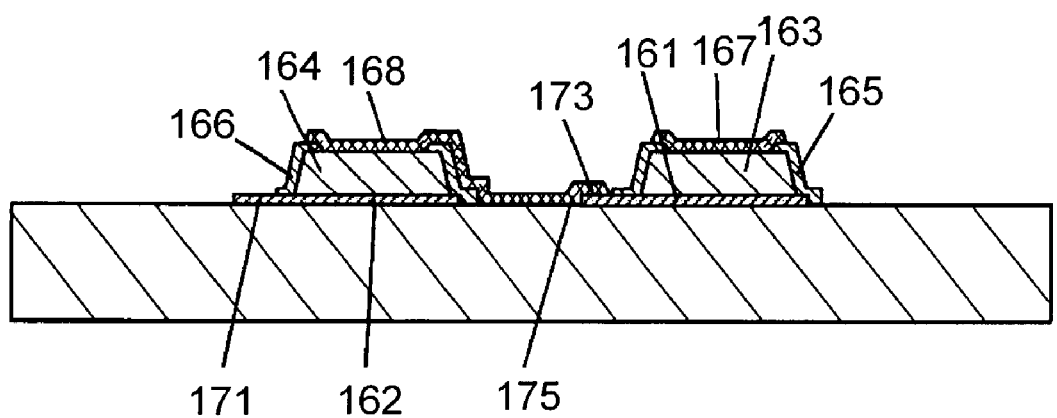
FIG. 17A is a block diagram at the X1—X1 section of FIG. 15A of a step of forming an opposed electrode and electric wiring on a first substrate during the manufacturing method of the fourth exemplary embodiment.
Figure 17B:
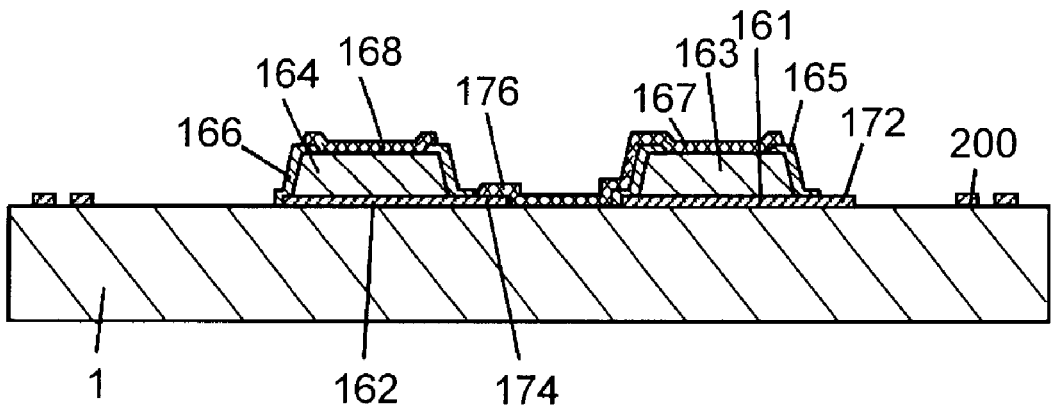
FIG. 17B is a block diagram at the X2—X2 section FIG. 15A of a step of forming the opposed electrode and electric wiring on the first substrate during the manufacturing method of the fourth exemplary embodiment.

Next, as shown in FIG. 16C and FIG. 16D, first insulating interlayers 165, 166 are formed on a region of first piezoelectric thin films 163, 164, except a first opposed electrode layer region and a predetermined region of main projection electrodes A1 (173, 172) and main projection electrodes B1 (171, 174).Then, as shown in FIG. 17A and FIG. 17B, opposed electrode A1 (167) and opposed electrode B1 (168) are formed on first piezoelectric thin films 163, 164, respectively. FIG. 17A is a sectional view along the X1—X1 line of FIG. 15A, and FIG. 17B is a sectional view along the X2—X2 line of FIG. 15A. In this case, as shown in FIG. 17A, along the X1—X1 line, opposed electrode B1 (168) is partially extended to form opposed projection electrode B1 (175), opposed projection electrode B1 (175) is electrically connected to main projection electrode A1 (173), and o electrode A1 (167) is formed only on first piezoelectric thin film 163.

On the other hand, as shown in FIG. 17B, along the X2—X2 line, opposed electrode A1 (167) is partially extended to form opposed projection electrode A1 (176), opposed projection electrode A1 (176) is electrically connected to main projection electrode B1 (174),and opposed electrode B1 (168) is formed only on first piezoelectric thin film 164. By completing formation of the above configurations, steps of film forming and processing on first substrate 1 are completed.

Figure 18A:
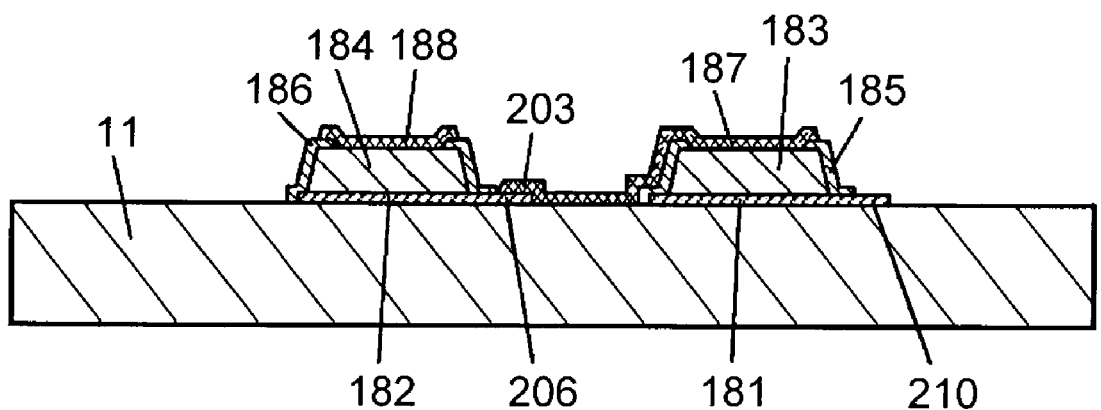
FIG. 18A is a block diagram at the X1—X1 section of FIG. 15A of a step of forming an opposed electrode and electric wiring on a second substrate during the manufacturing method of the fourth exemplary embodiment.
Figure 18B:
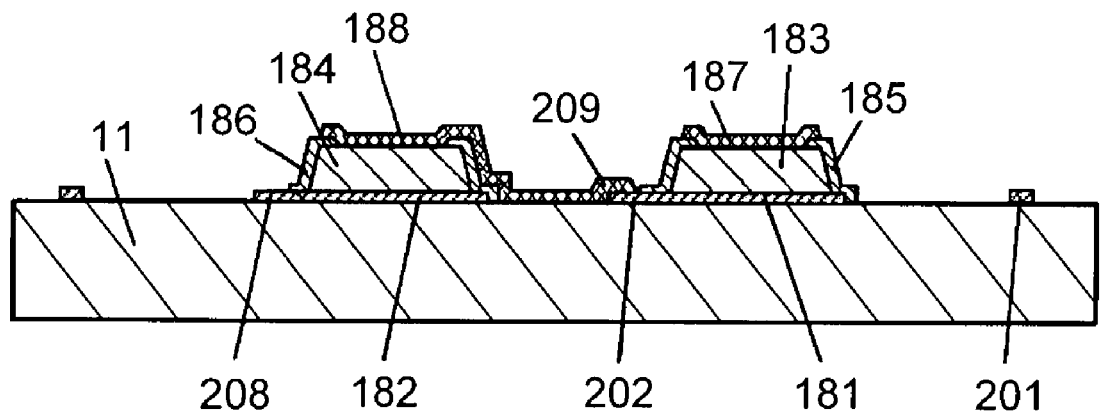
FIG. 18B is a block diagram at the X2—X2 section of FIG. 15A of a step of forming the opposed electrode and electric wiring on the second substrate during the manufacturing method of the fourth exemplary embodiment.

Next, the steps of film forming and processing on second substrate 11 will be described by using FIG. 18A and FIG. 18B. FIG. 18A is a sectional view along the X1—X1 line of FIG. 15A, and FIG. 18B is a sectional view along the X2—X2 line of FIG. 15A, showing a state of processing completed on second substrate 11. As is obvious from a comparison between FIG. 18A and FIG. 18B, and FIG. 17A and FIG. 17B respectively, on second substrate 11, respective shapes are reverse to those shown in FIG. 17A and FIG. 17B. That is, as shown in FIG. 18A, main electrode A2 (181) and main electrode B2 (182) are formed at bottom surfaces of second piezoelectric thin films 183, 184 on second substrate 11, respectively, and also, main projection electrode A2 (210) and main projection electrode B2 (206) are formed extending in the same direction (rightward in the figure) from the second piezoelectric thin films 183, 184, respectively. Opposed electrode A2 (187) and opposed electrode B2 (188) are respectively formed on second piezoelectric thin films 183, 184, and opposed electrode A2 (187) is partially extended to form opposed projection electrode A2(203). Opposed projection electrode A2 (203) is electrically connected to main projection electrode B2(206).

On the other hand, in FIG. 18B, main electrode A2 (181) and main electrode B2 (182) have main projection electrode A2 (202) and main projection electrode B2 (208) formed extending in the same direction (leftward in the figure) from the second piezoelectric thin films 183, 184, respectively. When main electrode A2 (181) and main electrode B2 (182) are etched into predetermined shapes, it is preferable to form second marker 201 at the same time. Opposed electrode B2 (188) is partially extended to form opposed projection electrode B2 (209). Opposed projection electrode B2 (209) and main projection electrode A2 (202) are electrically connected to each other.

Figure 19A:
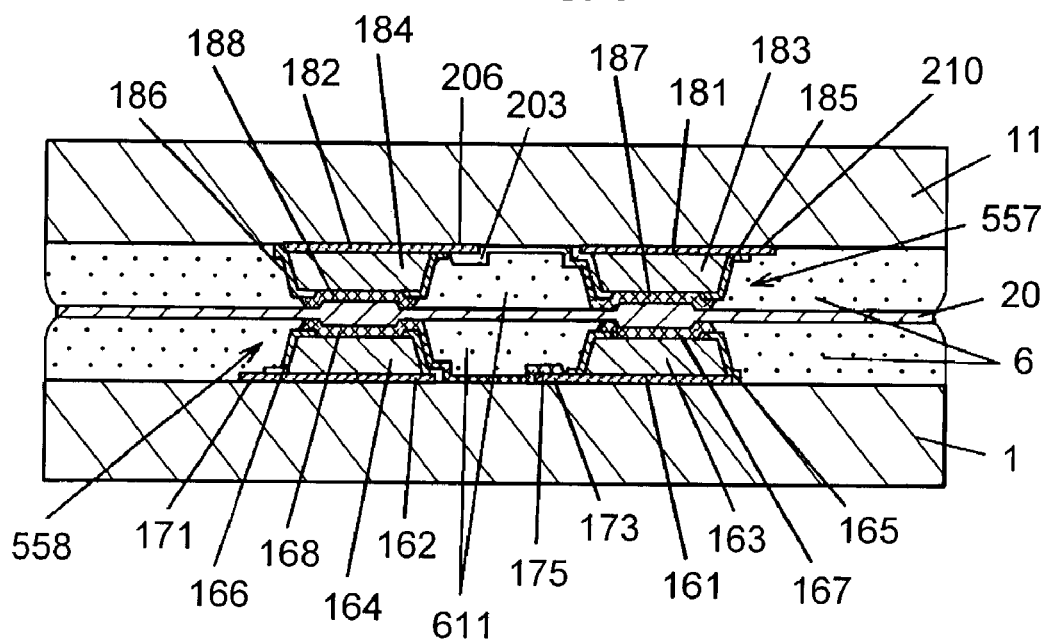
FIG. 19A is a block diagram at the X1—X1 section of FIG. 15A of a step of bonding a structure on the first substrate to a structure on the second substrate during the manufacturing method of the fourth exemplary embodiment.
Figure 19B:
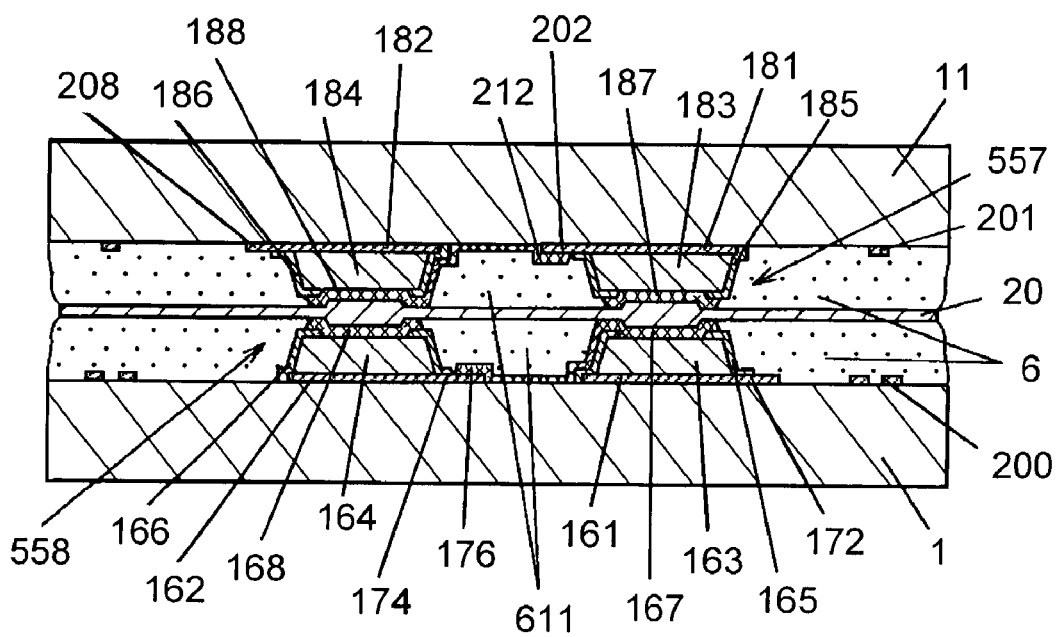
FIG. 19B is a block diagram at the X2—X2 section FIG. 15A of a step of bonding the structure on the first substrate to the structure on the second substrate during the manufacturing method of the fourth exemplary embodiment.

After processing laminate bodies on respective substrates 1, 11 into the configurations shown in FIG. 17A, FIG. 17B, FIG. 18A and FIG. 18B, respectively, insulating resin layers and further adhesive layers are formed thereon, respectively, and those are positioned by first marker 200 and second marker 201 for bonding, thereby forming structures 557, 558 as shown in FIG. 19A and FIG. 19B. FIG. 19A is a sectional view along the X1—X1 line of FIG. 15A, and FIG. 19B is a sectional view along the X2—X2 line of FIG. 15A. These steps can be executed in the same ways as in the first exemplary embodiment. The same elements as those in FIG. 15A to FIG. 18B are given same reference numerals.

Figure 20A:
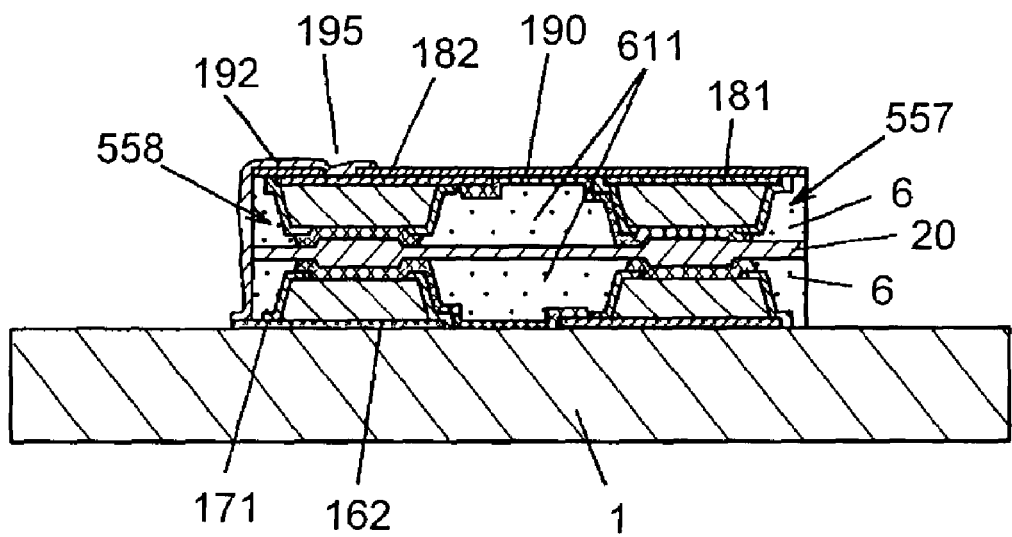
FIG. 20A is a block diagram at the X1—X1 section of FIG. 15A of a step of forming connection wiring during the manufacturing method of the fourth exemplary embodiment.
Figure 20B:
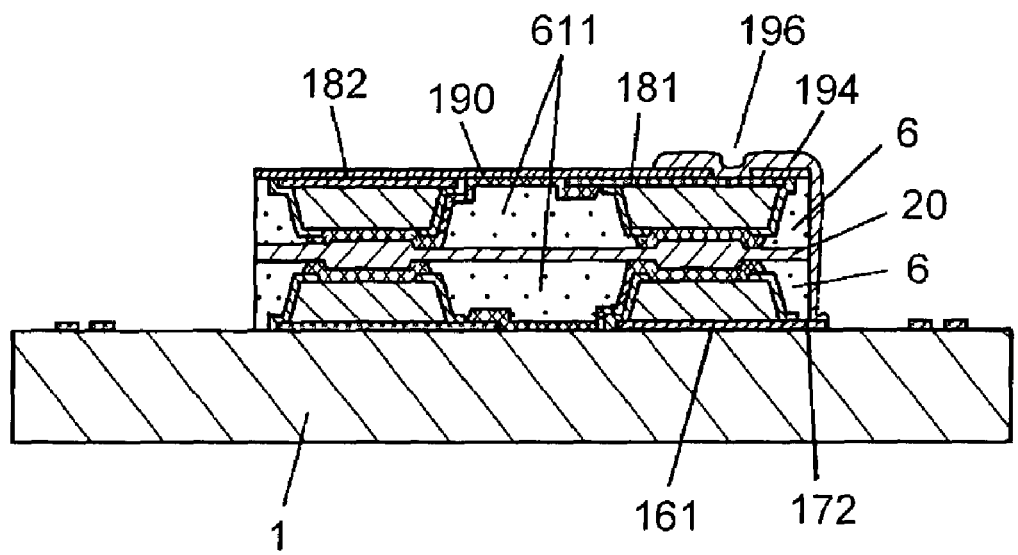
FIG. 20B is a block diagram at the X2—X2 section of FIG. 15A of a step of forming connection wiring during the manufacturing method of the fourth exemplary embodiment.

Further, only second substrate 11 is selectively removed to separate structures 557, 558. In this case, as shown in FIG. 15A and FIG. 20B, insulating resin layer 611 in a wiring connection regionremains. As for a method of removing substrate 11, and etching to remove insulating resin layer 611 and adhesive layer 20, the same method as in the first exemplary embodiment can be employed. Also, changing a photo mask is sufficient for leaving insulating resin layer 611 in the wiring connection region.

After etching, third insulating interlayer 190 is formed, which at least protects main electrode A2 (181) and main electrode B2 (182) of structures 557, 558, and there are provided openings 195, 196 for exposing predetermined portions of main electrode A2 (181) and main electrode B2 (182). At a section along the X1—X1 line, as shown in FIG. 20A, connection wiring 192 is formed so that main electrode B2 (182) and main projection electrode B1 (171) are connected through opening 195. Also, as shown in FIG. 20B, at a section along the X2—X2 line, connection wiring 194 is formed so that main electrode A2 (181) and main projection electrode A1 (172) are connected through opening 196. It is preferable to form these connection wirings 192, 194 individually or simultaneously by photolithography or an etching process.

After forming connection wirings 192, 194 in this way, by removing first substrate 1, two thin piezoelectric elements 555, 556 are integrated due to insulating resin layer 611 in the connection wiring region, and it is possible to obtain a configuration provided with only two pieces of connection electrode pads 28 for connecting the main electrode layers and opposed electrode layers extending from two thin piezoelectric elements 555, 556 to piezoelectric electrode pads 64 of flexure 60.

By using such a configuration, it becomes easier to handle an actuator having a pair of thin film piezoelectric elements, and a step of making a connection to an external terminal of the actuator, such as a wire lead to the flexure, can be greatly simplified. On the other hand, it is not necessary to increase the number of steps for realizing a connection wiring process, and further, productivity of actuators can be improved.

Fifth Exemplary Embodiment

Figure 21A:
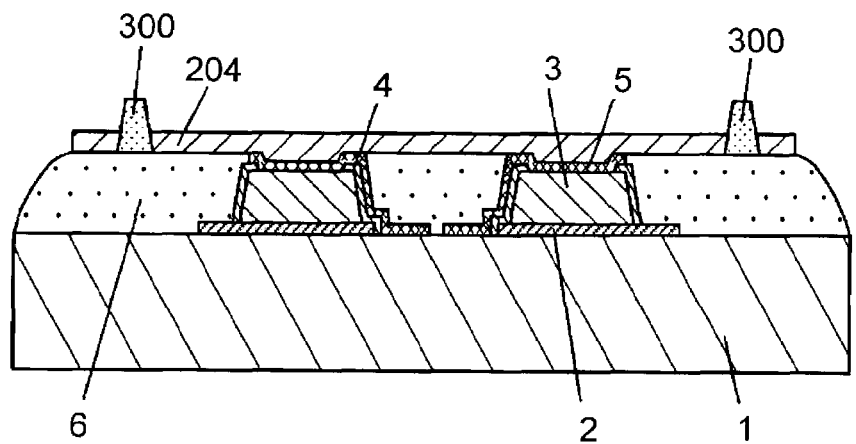
FIG. 21A is a block diagram of forming a structure with fitting portions formed on a first substrate during a manufacturing method of a fifth exemplary embodiment of the present invention.
Figure 21B:
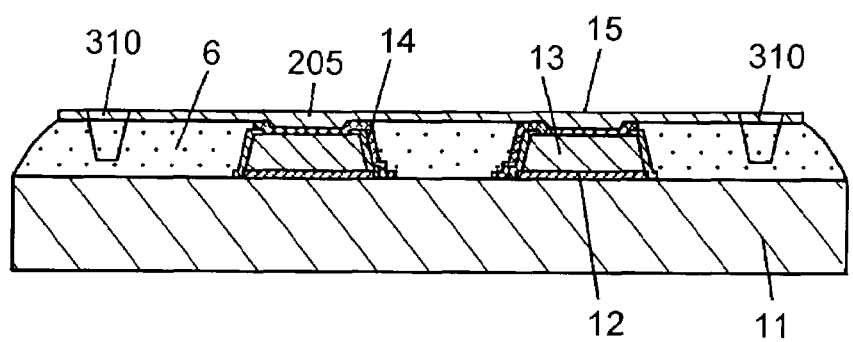
FIG. 21B is a block diagram of forming a structure with fitting portions formed on a second substrate during the manufacturing method of the fifth exemplary embodiment.

In a manufacturing method of a fifth exemplary embodiment of the present invention, in the same manufacturing method as in the first exemplary embodiment, as shown in FIG. 21A and FIG. 21B, insulating resin layer 6 is formed on first substrate 1 and second substrate 11. Then, protrusion 300 and depression 310 are formed at a specified position of insulating resin layer 6 formed on first substrate 1 and at a position corresponding to the specified position of insulating resin layer 6 formed on second substrate 11, respectively. After forming this protrusion 300 and depression 310 respectively, adhesive layers 204, 205 are formed. As a method of forming protrusion 300 and depression 310 on the respective substrates, the following method, for example, can be employed after forming insulating resin layer 6. When protrusion 300 is formed by applying photo-resist, the photo-resist remains so as to formdepression 310. Also, depression 310 can be formed by etching insulating resin layer 6, using a photo-resist as a mask.

Figure 21C:
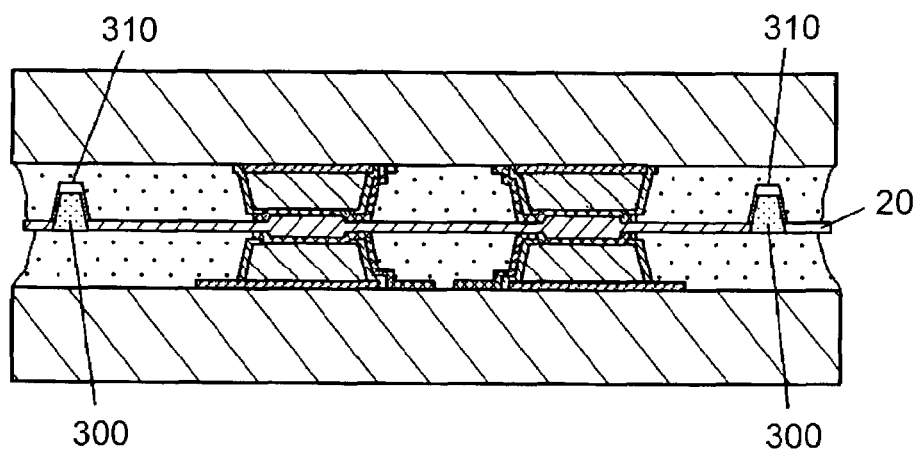
FIG. 21C is a block diagram of a step of positioning and bonding a structure on the first substrate to a structure on the second substrate by using each fitting portion during the manufacturing method of the fifth exemplary embodiment.

As shown in FIG. 21C, when piezoelectric thin films of first substrate 1 and second substrate 11 are opposed and bonded to each other, positioning is very easy because protrusion 300 fits into depression 310, and also, there is no misalignment of the substrates relative to each other while adhesive layers 204, 205 are integrally solidified into adhesive layer 20.

After bonding, thin film piezoelectric elements 541, 542 are formed according to the same steps as in the first exemplary embodiment. By such a method, a piezoelectric thin film formed on the first substrate and a piezoelectric thin film formed on the second substrate can be easily and accurately positioned and bonded to each other, and it becomes possible to simplify the manufacturing method. It is preferable to form a fitting portion on the piezoelectric thin film or on each of the substrates.

In the present exemplary embodiment, protrusion 300 and depression 310 are formed on insulating resin layer 6, but the present invention is not limited to this configuration. It is also possible to use a pattern shape in that a pattern on a surface of first opposed electrode layer 5 of first piezoelectric thin film 3 fits snugly against a pattern on a surface of second opposed electrode layer 15 of second piezoelectric thin film 13. Such a pattern shape can be obtained by only changing a photo-mask used for predetermined pattern forming of first insulating interlayer 4 and second insulating interlayer 14.

What is claimed is:

1. A thin film piezoelectric element, comprising:
a structure including
(i) a first piezoelectric thin film sandwiched between a first main electrode layer and a first opposed electrode layer, said first main electrode layer and said first opposed electrode layer each having a projection extended away from said first main electrode layer, and
(ii) a second piezoelectric thin film sandwiched between a second main electrode layer and a second opposed electrode layer in a mirror-symmetrical relationship with respect to said first piezoelectric thin film, said second opposed electrode layer having a projection extended away from said second main electrode layer,
with said first opposed electrode layer and said second opposed electrode layer being opposed and bonded to each other;
an insulating resin layer on an outer periphery of said structure; and
connection wiring arranged on said insulating resin layer in order to establish electrical connection between said projection of said first main electrode layer and said second main electrode layer, and between said projection of said first opposed electrode layer and said projection of said second opposed electrode layer.

2. A thin film piezoelectric element, comprising:
a structure including
(i) a first piezo electric thin film sandwiched between a first main electrode layer and a first opposed electrode layer, said first main electrode layer and said first opposed electrode layer each having a projection extended away from said first main electrode layer, and
(ii) a second piezoelectric thin film sandwiched between a second main electrode layer and a second opposed electrode layer in a mirror-symmetrical relationship with respect to said first piezoelectric thin film, with said first opposed electrode layer and said second opposed electrode layer being opposed and bonded to each other via an adhesive layer so as to be electrically conductive;

an insulating resin layer on an outer periphery of said structure, and connection wiring arranged on said insulating resin layer in order to establish electrical connection between said projection of said first main electrode layer and said second main electrode layer.

3. An actuator, comprising:

first and second thin film piezoelectric elements disposed apart from one another on a substrate at a specific interval, wherein said first and second thin film piezoelectric elements are constructed and arranged to be expanded and contracted in opposite directions, respectively, with each of said first and second thin film piezoelectric elements including:

(i) a structure including
  (a) a first piezoelectric thin film sandwiched between a first main electrode layer and a first opposed electrode layer, said first main electrode layer and said first opposed electrode layer each having a projection extended away from said first main electrode layer, and
  (b) a second piezoelectric thin film sandwiched between a second main electrode layer and a second opposed electrode layer in a mirror-symmetrical relationship with respect to said first piezoelectric thin film, said second opposed electrode layer having a projection extended away from said second main electrode layer,
  with said first opposed electrode layer and said second opposed electrode layer being opposed and bonded to each other;

(ii) an insulating resin layer on an outer periphery of said structure; and (iii) connection wiring arranged on said insulating resin layer in order to establish electrical connection between said projection of said first main electrode layer and said second main electrode layer, and between said projection of said first opposed electrode layer and said projection of said second opposed electrode layer.

4. An actuator, comprising:

first and second thin film piezoelectric elements disposed apart from one another on a substrate at a specific interval, wherein said first and second thin film piezoelectric elements are constructed and arranged to be expanded and contracted in opposite directions, respectively, with respective piezoelectric operation generating regions of said first and second thin film piezoelectric elements being in a mirror-symmetrical relationship relative to each other with respect to a center line of the specific interval, and with each of said first and second thin film piezoelectric elements including:

(i) a structure including
  (a) a first piezoelectric thin film sandwiched between a first main electrode layer and a first opposed electrode layer, said first main electrode layer and said first opposed electrode layer each having a projection extended away from said first main electrode layer, and
  (b) a second piezoelectric thin film sandwiched between a second main electrode layer and a second opposed electrode layer in a mirror-symmetrical relationship with respect to said first piezoelectric thin film,
  with said first opposed electrode layer and said second opposed electrode layer being opposed and bonded to each other via an adhesive layer so as to be electrically conductive;

(ii) an insulating resin layer on an outer periphery of said structure, and (iii) connection wiring arranged on said insulating resin layer in order to establish electrical connection between said projection of said first main electrode layer and said second main electrode layer.

5. The actuator as defined in claim 3, further comprising:

connection wiring for establishing connection between said first and second main electrode layers of said first thin film piezoelectric element and said first and second opposed electrode layers of said second thin film piezoelectric element;

connection wiring for establishing connection between said first and second opposed electrode layers of said first thin film piezoelectric element and said first and second main electrode layers of said second thin film piezoelectric element; and two connection electrode pads for being connected to external terminals.

6. The actuator as defined in claim 4, further comprising:

connection wiring for establishing connection between said first and second main electrode layers of said first thin film piezoelectric element and said first and second opposed electrode layers of said second thin film piezoelectric element; and connection wiring for establishing connection between said first and second opposed electrode layers of said first thin film piezoelectric element and said first and second main electrode layers of said second thin film piezoelectric element; and two connection electrode pads for being connected to external terminals.

7. A magnetic recording and reproducing disk device, comprising:

a magnetic disk;

a head slider with a magnetic head mounted thereon;

a flexure for fixing said head slider, an arm with said flexure fixed thereon; and a first positioning device and a second positioning device for positioning said head slider to a predetermined track position on said magnetic disk, wherein said first positioning device is a driving device to turn said arm, and said second positioning device is an actuator including first and second thin film piezoelectric elements disposed apart from one another on said flexure at a specific interval, with said first and second thin film piezoelectric elements being constructed and arranged to be expanded and contracted in opposite directions, respectively, so as to finely move said head slider to a predetermined track position on said magnetic disk, and with each of said first and second thin film piezoelectric elements having (i) a structure including
  (a) a first piezoelectric thin film sandwiched between a first main electrode layer and a first opposed electrode layer, said first main electrode layer and said first opposed electrode layer each having a projection extended away from said first main electrode layer, and (b) a second piezoelectric thin film sandwiched between a second main electrode layer and a second opposed electrode layer in a mirror-symmetrical relationship with respect to said first piezoelectric thin film, said second opposed electrode layer having a projection extended away from said second main electrode layer, with said first opposed electrode layer and said second opposed electrode layer being opposed and bonded to each other;

(ii) an insulating resin layer on an outer periphery of said structure; and (iii) connection wiring arranged on said insulating resin layer in order to establish electrical connection between said projection of said first main electrode layer and said second main electrode layer, and between said projection of said first opposed electrode layer and said projection of said second opposed electrode layer.

8. A magnetic recording and reproducing disk device, comprising:

a magnetic disk;
a head slider with a magnetic head mounted thereon;
a flexure for fixing said head slider;
an arm with said flexure fixed thereon; and
a first positioning device and a second positioning device for positioning said head slider to a predetermined track position on said magnetic disk, wherein said first positioning device is a driving device to turn said arm, and said second positioning device is an actuator including first and second thin film piezoelectric elements disposed apart from one another on said flexure at a specific interval, with said first and second thin film piezoelectric elements being constructed and arranged to be expanded and contracted in opposite directions, respectively, so as to finely move said head slider to a predetermined track position on said magnetic disk, with respective piezoelectric operation generating regions of said first and second thin film piezoelectric elements being in a mirror-symmetrical relationship relative to each other with respect to a center line of the specific interval, and with each of said first and second thin film piezoelectric elements having:

(i) a structure including
  (a) a first piezoelectric thin film sandwiched between a first main electrode layer and a first opposed electrode layer, said first main electrode layer and said first opposed electrode layer each having a projection extended away from said first main electrode layer, and
  (b) a second piezoelectric thin film sandwiched between a second main electrode layer and a second opposed electrode layer in a mirror-symmetrical relationship with respect to said first piezoelectric thin film, with said first opposed electrode layer and said second opposed electrode layer being opposed and bonded to each other via an adhesive layer so as to be electrically conductive;

(ii) an insulating resin layer on an outer periphery of said structure, and (iii) connection wiring arranged on said insulating resin layer in order to establish electrical connection between said projection of said first main electrode layer and said second main electrode layer.

9. A magnetic recording and reproducing disk device, comprising:

a magnetic disk;
a head slider with a magnetic head mounted thereon;
a flexure for fixing said head slider;
an arm with said flexure fixed thereon; and
a first positioning device and a second positioning device for positioning said head slider to a predetermined track position on said magnetic disk;

wherein said first positioning device is a driving device to turn said arm, and said second positioning device is an actuator including (i) first and second thin film piezoelectric elements disposed apart from one another on said flexure at a specific interval, with said first and second thin film piezoelectric elements being constructed and arranged to be expanded and contracted in opposite directions, respectively, so as to finely move said head slider to a predetermined track position on said magnetic disk, and with each of said first and second thin film piezoelectric elements having:

(a) a structure including
  (1) a first piezoelectric thin film sandwiched between a first main electrode layer and a first opposed electrode layer, said first main electrode layer and said first opposed electrode layer each having a projection extended away from said first main electrode layer, and
  (2) a second piezoelectric thin film sandwiched between a second main electrode layer and a second opposed electrode layer in a mirror-symmetrical relationship with respect to said first piezoelectric thin film, said second opposed electrode layer having a projection extended away from said second main electrode layer, with said first opposed electrode layer and said second opposed electrode layer being opposed and bonded to each other;

(b) an insulating resin layer on an outer periphery of said structure; and (c) connection wiring arranged on said insulating resin layer in order to establish electrical connection between said projection of said first main electrode layer and said second main electrode layer, and between said projection of said first opposed electrode layer and said projection of said second opposed electrode layer;

(ii) connection wiring for establishing connection between said first and second main electrode layers of said first thin film piezoelectric element and said first and second opposed electrode layers of said second thin film piezoelectric element;

(iii) connection wiring for establishing connection between said first and second opposed electrode layers of said first thin film piezoelectric element and said first and second main electrode layers of said second thin film piezoelectric element; and (iv) two connection electrode pads for being connected to external terminals.

10. A magnetic recording and reproducing disk device, comprising:

a magnetic disk;
a head slider with a magnetic head mounted thereon;
a flexure for fixing said head slider;
an arm with said flexure fixed thereon; and
a first positioning device and a second positioning device for positioning said head slider to a predetermined track position on said magnetic disk;

wherein said first positioning device is a driving device to turn said arm, and said second positioning device is an actuator including
(i) first and second thin film piezoelectric elements disposed apart from one another on said flexure at a specific interval, with said first and second thin film piezoelectric elements being constructed and arranged to be expanded and contracted in opposite directions, respectively, so as to finely move said head slider to a predetermined track position on said magnetic disk, with respective piezoelectric operation generating regions of said first and second thin film piezoelectric elements being in a mirror-symmetrical relationship relative to each other with respect to a center line of the specific interval, and with each of said first and second thin film piezoelectric elements having:
  (a) a structure including
    (1) a first piezoelectric thin film sandwiched between a first main electrode layer and a first opposed electrode layer, said first main electrode layer and said first opposed electrode layer each having a projection extended away from said first main electrode layer, and
    (2) a second piezoelectric thin film sandwiched between a second main electrode layer and a second opposed electrode layer in a mirror-symmetrical relationship with respect to said first piezoelectric thin film,
with said first opposed electrode layer and said second opposed electrode layer being opposed and bonded to each other via an adhesive layer so as to be electrically conductive;
  (b) an insulating resin layer on an outer periphery of said structure, and
  (c) connection wiring arranged on said insulating resin layer in order to establish electrical connection between said projection of said first main electrode layer and said second main electrode layer;
(ii) connection wiring for establishing connection between said first and second main electrode layers of said first thin film piezoelectric element and said first and second opposed electrode layers of said second thin film piezoelectric element;
(iii) connection wiring for establishing connection between said first and second opposed electrode layers of one said first film piezoelectric element and said first and second main electrode layers of said second thin film piezoelectric element; and
(iv) two connection electrode pads for being connected to external terminals.

* * * * *

UNITED STATES PATENT AND TRADEMARK OFFICE
CERTIFICATE OF CORRECTION

PATENT NO. : 7,006,334 B2 Page 1 of 1
APPLICATION NO. : 10/387378
DATED : February 28, 2006
INVENTOR(S) : Hirokazu Uchiyama It is certified that error appears in the above-identified patent and that said Letters Patent is hereby corrected as shown below:

IN THE CLAIMS

In column 22, line 57, please replace "a first piezo electric thin film" with --a first piezoelectric thin film--.

Signed and Sealed this

Thirtieth Day of January, 2007

JON W. DUDAS
*Director of the United States Patent and Trademark Office*